US008262796B2

(12) United States Patent　　(10) Patent No.: US 8,262,796 B2
Ichinose et al.　　(45) Date of Patent: Sep. 11, 2012

(54) β-$GA_2O_3$ SINGLE CRYSTAL GROWING METHOD, THIN-FILM SINGLE CRYSTAL GROWING METHOD, $GA_2O_3$ LIGHT-EMITTING DEVICE, AND ITS MANUFACTURING METHOD

(75) Inventors: Noboru Ichinose, Tokyo (JP); Kiyoshi Shimamura, Tokyo (JP); Kazuo Aoki, Tokyo (JP); Encarnacion Antonia Garcia Villora, Tokyo (JP)

(73) Assignee: Waseda University, Tokyo (JP)

( * ) Notice: Subject to any disclaimer, the term of this patent is extended or adjusted under 35 U.S.C. 154(b) by 16 days.

(21) Appl. No.: 12/659,609

(22) Filed: Mar. 15, 2010

(65) Prior Publication Data

US 2010/0229789 A1　Sep. 16, 2010

Related U.S. Application Data

(62) Division of application No. 12/155,991, filed on Jun. 12, 2008, now Pat. No. 7,713,353, which is a division of application No. 10/546,484, filed on Nov. 23, 2005, now Pat. No. 7,393,411.

(30) Foreign Application Priority Data

Feb. 24, 2003　(JP) ................................. 2003-046552
Mar. 12, 2003　(JP) ................................. 2003-066020
May 15, 2003　(JP) ................................. 2003-137916

(51) Int. Cl.
　　*C30B 25/00*　　(2006.01)
(52) U.S. Cl. .............. 117/101; 117/84; 117/88; 117/92; 117/99; 117/103; 117/108

(58) Field of Classification Search .................. 117/101, 117/84, 88, 92, 99, 103, 108
See application file for complete search history.

(56) References Cited

U.S. PATENT DOCUMENTS

| | | | |
|---|---|---|---|
| 5,330,855 A | 7/1994 | Semancik et al. |
| 5,418,216 A | 5/1995 | Fork |
| 5,625,202 A | 4/1997 | Chai |
| 6,914,268 B2 | 7/2005 | Shei et al. |
| 6,977,397 B2 | 12/2005 | Ichinose et al. |
| 7,169,227 B2 | 1/2007 | Maruska et al. |
| 7,173,277 B2 | 2/2007 | Tamura et al. |
| 7,182,812 B2 | 2/2007 | Sunkara et al. |

(Continued)

FOREIGN PATENT DOCUMENTS

EP　　0 863 555 A2　　9/1998

(Continued)

OTHER PUBLICATIONS

Xiao, Liquid-target pulsed laser deposition of gallium nitride thin films, Applied Surface Science 127-129 (1998) 425-430.*

(Continued)

*Primary Examiner* — Matthew Song
(74) *Attorney, Agent, or Firm* — McGinn IP Law Group, PLLC

(57) ABSTRACT

A thin-film single crystal growing method includes preparing a substrate, irradiating an excitation beam on a metallic target made of a pure metal or an alloy in a predetermined atmosphere, and combining chemical species including any of atoms, molecules, and ions released from the metallic target by irradiation of the excitation beam with atoms contained in the predetermined atmosphere to form a thin film on the substrate.

14 Claims, 27 Drawing Sheets

U.S. PATENT DOCUMENTS

| | | | |
|---|---|---|---|
| 7,319,249 B2 | 1/2008 | Ichinose et al. | |
| 7,393,411 B2 | 7/2008 | Ichinose et al. | |
| 7,445,671 B2 | 11/2008 | Sunkara et al. | |
| 7,488,384 B2 | 2/2009 | Van Patten et al. | |
| 7,608,472 B2 | 10/2009 | Ichinose et al. | |
| 7,629,615 B2 | 12/2009 | Ichinose et al. | |
| 7,713,353 B2 * | 5/2010 | Ichinose et al. | 117/101 |
| 7,824,955 B2 * | 11/2010 | White et al. | 438/104 |
| 2002/0070449 A1 | 6/2002 | Yagi et al. | |
| 2003/0107098 A1 * | 6/2003 | Ota et al. | 257/436 |
| 2003/0219994 A1 | 11/2003 | Goodhue | |
| 2004/0113156 A1 | 6/2004 | Tamura et al. | |
| 2005/0274972 A1 | 12/2005 | Roth et al. | |
| 2006/0068329 A1 | 3/2006 | Aylward et al. | |
| 2006/0150891 A1 | 7/2006 | Ichinose et al. | |
| 2007/0131951 A1 | 6/2007 | Ikemoto et al. | |
| 2007/0166967 A1 | 7/2007 | Ichinose et al. | |
| 2008/0008964 A1 | 1/2008 | Chan et al. | |
| 2008/0265264 A1 | 10/2008 | Ichinose et al. | |

FOREIGN PATENT DOCUMENTS

| | | |
|---|---|---|
| EP | 0 975 027 A2 | 1/2000 |
| EP | 1 367 657 A2 | 12/2003 |
| JP | 02-026899 | 1/1990 |
| JP | 03/093608 | 4/1991 |
| JP | 05-179430 | 7/1993 |
| JP | 08-242114 | 9/1996 |
| JP | 11-145717 | 5/1999 |
| JP | 2000-174529 | 6/2000 |
| JP | 2001-286814 | 10/2001 |
| JP | 2002-68889 | 3/2002 |
| JP | 2002-261294 | 9/2002 |
| WO | WO 02/43466 A2 | 6/2002 |
| WO | WO 02/089223 | 11/2002 |

OTHER PUBLICATIONS

Orita, Pulsed laser deposition system for producing oxide thin films at high temperature, Review of the Scientific Instruments, vol. 72, No. 8, Aug. 2001.*

International Search Report dated Aug. 17, 2004.

K.T. Vilke. Methods of growing crystals, publisher "Nedra," Leningrad, 1968, p. 271, Figure 270-(2).

Russian Federation Office Action dated Nov. 20, 2006.

Villora E.G., et al., Cathodoluminescence of undoped B-$Ga_2O_3$ single crystals. "Solid State Communications," vol. 120, 2001, p. 455-458-(1); abstract only.

Dunescu M., et al., ZnO thin film deposition by laser ablation of Zn target in oxygen reactive atmosphere. "Applied Surface Science," vol. 106, 1996, p. 149-153-(3); abstract only.

Villora, et al., Infrared Reflectance and Electrical Conductivity of beta-Ga2O3, Mar. 10, 2002, Physical State Solids 193No. 1, Wiley, p. 187-195.

Japanese Office Action dated May 29, 2007, with partial English translation.

Y. Tomm, J.M. Ko, A. Yoshikawa, T. Fukuda, Floating zone growth of $\beta$-$Ga_2O_3$: A new window material for optoelectronic device applications, Solar Energy Materials & Solar Cells 66 (2001) 369-374.

European Search Report dated Mar. 28, 2008.

Y. Tomm, et al., "Czochralski grown $Ga_2O_3$ Crystals," Journal of Crystal Growth, Sep. 2000, pp. 510-514.

Japanese Office Action dated Feb. 17, 2009 with a partial English translation.

Japanese Office Action dated Dec. 24, 2008 with a partial English translation.

Villora, et al., "Electron Microscopy Studies of Microstructures in B-$Ga_2O_3$ Single Crystals", Materials Research Bulletin, 2002, 37, pp. 769-774.

European Office Action dated Jun. 2, 2009.

European Search Report dated Jan. 28, 2011.

Orita M., et al. "Preparation of highly conductive, deep ultraviolet transparent beta-Ga2O3 thin film at low deposition temperatures", Thin Solid Films, vol. 411, No. 1, May 22, 2002, pp. 134-139.

Orita M., et al. "Pulsed laser deposition system for producing oxide thin films at high temperature", Review of Scientific Instruments, vol. 72, No. 8, Aug. 1, 2001, pp. 3340-3343.

Hosono H. et al., "Frontier of transparent conductive oxide thin films", Vacuum, vol. 66, No. 3-4, Aug. 19, 2002, pp. 419-425.

Tomm Y. et al,. "Floating zone growth of beta-Ga2O3: a new window material for optoelectronic device applications", Solar Energy Materials and Solar Cells, vol. 66, No. 1-4, Feb. 1, 2001, pp. 369-374, XP004224698. (Previously submitted).

Villora E. G. et al., "Cathodoluminescence of undoped Beta-Ga2O3 single crystals", Solid State Communications, vol. 120, Jan. 2001, pp. 455-458, XP002981301. (Previously submitted).

Tomm V. et al., Czochralski grown Ga2O3 crystals, Journal of Crystal Growth, vol. 220, No. 4, Dec. 2000, pp. 510-514, XP004225848. (Previously submitted).

European Search Report dated Sep. 15, 2011.

Tomm Y et al.: "Czochralski grown Ga2O3 crystals", Journal of Crystal Growth, Elsevier, Amsterdam, NL, vol. 220, No. 4, Dec. 2000, pp. 510-514, XP004225848, ISSN: 0022-0248. (previously submitted).

Tomm Y et al.: "Floating zone growth of beta-Ga2O3: a new window material for optoelectronic device and applications", Solar Energy Materials and Solar Cells, Elsevier Science Publishers, Amsterdam,. NL, vol. 66, No. 1-4, Feb. 1, 2001, pp. 369-374, XP004224698, ISSN: 0927-0248, DOI: 10.1016/50927-0248(00)00196-3 (previously submitted).

Orita M et al.: "Preparation of highly conductive, deep ultraviolet transparent beta-Ga2O3 thin film at low deposition temperatures", Thin Solid Films, Elsevier-Sequoia S.A. Lausanne, CH, vol. 411, No. 1, May 22, 2002, pp. 134-139, XP004367243, ISSN: 0040-6090, DOI: 10.1016/50040-6090(02) 00202-X, p. 135 (previously submitted).

* cited by examiner

FIG. 3
(a)
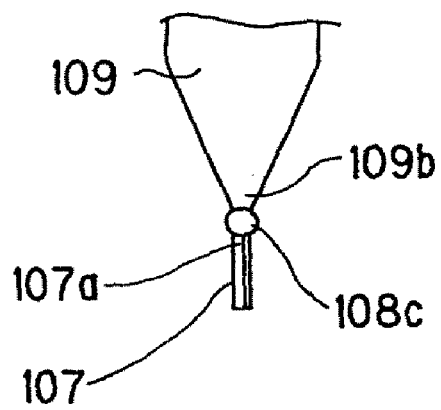
(b)
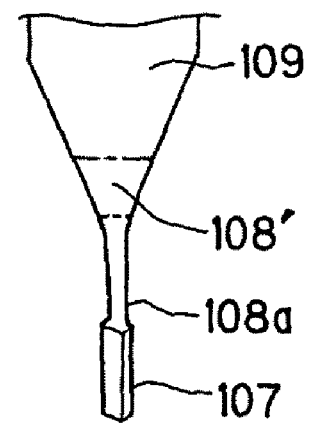
(c)
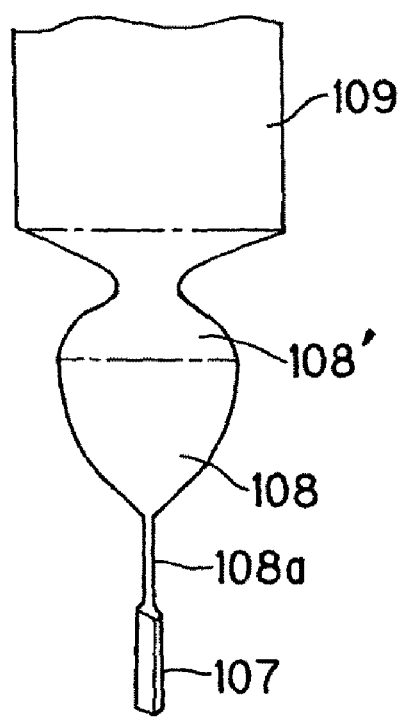
(d)
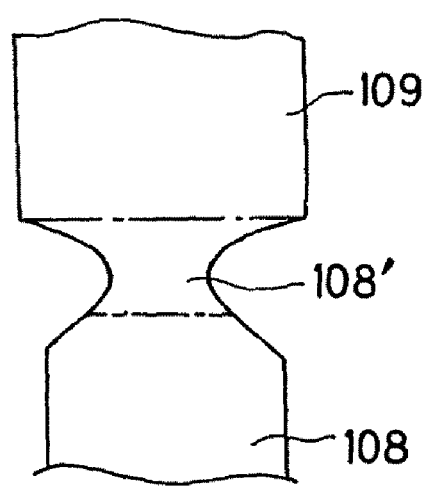

β-GA₂O₃ SINGLE CRYSTAL GROWING METHOD, THIN-FILM SINGLE CRYSTAL GROWING METHOD, GA₂O₃ LIGHT-EMITTING DEVICE, AND ITS MANUFACTURING METHOD

The present application is a Divisional Application of U.S. patent application Ser. No. 12/155,991 filed on Jun. 12, 2008 now U.S. Pat. No. 7,713,353, which is a Divisional Application of U.S. patent application Ser. No. 10/546,484, filed on Nov. 23, 2005, now U.S. Pat. No. 7,393,411.

The present application is based on International Application No. PCT/JP2004/1653 filed on Feb. 24, 2004, and Japanese patent application No. 2003-46552, No. 2003-66020, and No. 2003-137916, the entire contents of which are incorporated herein by reference.

TECHNICAL FIELD

The present invention relates to a $\beta$-$Ga_2O_3$ single crystal growing method, a thin-film single crystal growing method, a $Ga_2O_3$ light-emitting device, and its manufacturing method, and more particularly to a method for growing a $\beta$-$Ga_2O_3$ single crystal hardly cracking and having a weakened twinning tendency and an improved crystallinity, a method for growing a thin-film single crystal with high quality, a $Ga_2O_3$ light-emitting device capable of emitting light in the ultraviolet region, and its manufacturing method.

BACKGROUND TECHNOLOGY

A light-emitting device in the ultraviolet region is particularly expected significantly in a realization of fluorescent lamps of mercury-free, photocatalysts providing a clean atmosphere, oncoming generation DVDs realizing a higher density recording and the like. In view of such background, GaN blue light-emitting device has been realized.

In Japanese Patent No. 2778405, such GaN blue light-emitting device composed of a sapphire substrate, a buffer layer formed on the sapphire substrate, an n-type gallium nitride compound semiconductor layer formed on the buffer layer, an n-type cladding layer, an n-type active layer, a p-type cladding layer, and a p-type contact layer is described. The prior art GaN blue light-emitting device emits an ultraviolet radiation of 370 nm emission wavelength.

However, it is difficult to obtain a light-emitting device emitting a light having a shorter wavelength than the ultraviolet region because of a bandgap in a conventional GaN blue light-emitting device.

In this respect, it is considered that $\beta$-$Ga_2O_3$ and ZnO have a possibility of emitting a light having a shorter wavelength than the ultraviolet region, so that it is studied to use these compounds for light-emitting devices. For instance, it is studied to fabricate a $\beta$-$Ga_2O_3$ bulk single crystal substrate in accordance with CZ method (Czochralski method) or FZ (Floating Zone Technique) method.

On one hand, Japanese Patent Application Laid-Open No. 2002-68889 discloses to glow a ZnO thin film on a conventional substrate in accordance with PLD (Pulsed Laser Deposition) method.

FIG. 27 shows a substrate 170 formed from a conventional $\beta$-$Ga_2O_3$ bulk single crystal. As a conventional single crystal growing method for manufacturing a material of such substrate 170, the CZ method and the FZ method are known (see "Rev. Int. Hautes Temper. et Refract." No. 8, 1971; page 291).

The CZ method is conducted in accordance with the manner as described hereinafter.

First, an Ir crucible charged with $Ga_2O_3$ having 4N purity is covered by a silica tube, the Ir crucible is heated by a high-frequency oscillator while flowing a mixed gas obtained by adding 1 vol. % of oxygen gas into argon gas through the silica tube to melt a $Ga_2O_3$ powder, whereby a $Ga_2O_3$ polycrystalline melt is produced. Then, a $\beta$-$Ga_2O_3$ seed crystal prepared separately is allowed to be in contact with the molten $Ga_2O_3$, and the $\beta$-$Ga_2O_3$ seed crystal is drawn up at a rate of 1 mm/hour with a crystal rotation number of 15 rpm to fabricate a $\beta$-$Ga_2O_3$ single crystal. According to the present method, there is such an advantage that the $\beta$-$Ga_2O_3$ single crystal having a large diameter can be grown.

Moreover, FZ method is a manner for growing crystals while sustaining a raw material, for example, a $\beta$-$Ga_2O_3$ polycrystalline melt positioned on the upper side by a $\beta$-$Ga_2O_3$ seed crystal positioned on the under side. According to the present method, there are such advantages that a contamination can be prevented because no container is used, that there is no limitation of an atmosphere to be used due to a container applied, and that a material which reacts easily with a container used may be grown.

Furthermore, PLD method is a manner wherein a laser is irradiated to a composition material of a target thin film, for example, a ZnO target in a pulsed manner in an oxygen atmosphere of a very low pressure, so that components constituting the target are made to be in a plasma or molecular state, and the components in such a state are allowed to sputter on a substrate to grow a ZnO thin film on the substrate. Hence, a thin film can be fabricated easily in a simple device.

In a conventional CZ method, however, it is difficult to control a crystal growth, because of a violent evaporation or a remarkably unstable growth of melt components from a $Ga_2O_3$ melt.

Besides, although a single crystal of around 1 $cm^2$ is obtained dependent on a condition in FZ method, a twinning tendency or cracking appears because of a violent evaporation and a precipitous temperature gradient from a molten zone, whereby it is difficult to grow the single crystal in size and to make to be high quality. In addition, when the substrate 170 is fabricated with a $\beta$-$Ga_2O_3$ single crystal a direction of which is not fixed, it is very difficult to cut the crystal in a direction other than the cleavage surface (100), since a cracking 171 appears.

In a thin-film growing method according to a conventional PLD method, ZnO separates from a target made of a composition material of the objective thin film as clusters, and they are deposited on a substrate as they are, whereby ZnO molecules forms irregularities on the substrate, so that there is a fear of forming a thin film having a poor surface flatness. Besides, since there is a case where the target is deteriorated or transformed by laser irradiation, it becomes a factor for hindering a growth of thin-film single crystal.

Accordingly, an object of the present invention is to provide a $\beta$-$Ga_2O_3$ single crystal growing method wherein its crystal growth is easily controlled, and even if the resulting single crystal is worked into a substrate or the like which has a large size and high quality, cracking appears hardly.

Another object of the present invention is to provide a method for growing a thin-film single crystal by which a thin-film single crystal with high quality can be formed.

A still further object of the present invention is to provide a $Ga_2O_3$ light-emitting device capable of emitting a light having a shorter wavelength than that in the ultraviolet region, and its manufacturing method.

DISCLOSURE OF THE INVENTION

The present invention provides a $\beta$-$Ga_2O_3$ single crystal growing method, characterized by preparing a $\beta$-$Ga_2O_3$ seed crystal, and growing the β-Ga$_2$O$_3$ single crystal from the β-Ga$_2$O$_3$ seed crystal in a predetermined direction.

According to the constitution, cracking and a twinning tendency are reduced, while crystallinity becomes higher, and its workability is good.

The invention provides a thin-film single crystal growing method, characterized by preparing a substrate, irradiating an excitation beam on a metallic target made of a pure metal or an alloy in a predetermined atmosphere, and combining chemical species such as atoms, molecules, and ions released from the metallic target by irradiation of the excitation beam with atoms contained in the predetermined atmosphere to form a thin film on the substrate.

According to the constitution, when an excitation beam is irradiated on a metallic target, metallic atoms constituting the metallic target are excited, whereby chemical species such as metallic atoms, molecules, and ions are released due to thermal and photochemical actions, the chemical species thus released combine with radicals in the atmosphere, and the combined product grows on the substrate to form a thin film thereon.

The invention provides a Ga$_2$O$_3$ light-emitting device, characterized by providing a first layer made of a Ga$_2$O$_3$ single crystal and exhibiting n-type conductivity, and a second layer made of a Ga$_2$O$_3$ single crystal, exhibiting p-type conductivity, and formed on the first layer in contact therewith.

According to the constitution, since the second layer exhibiting p-type conductivity is formed on the first layer exhibiting n-type conductivity, a light-emitting device of PN junction may be formed, so that it becomes possible to emit a light in ultraviolet region due to a bandgap involved in a Ga$_2$O$_3$ single crystal.

BRIEF DESCRIPTION OF THE DRAWINGS

FIGS. 3($a$) to 3($d$) are views each showing a growing process of a β-Ga$_2$O$_3$ single crystal according to the first embodiment of the invention;

BEST MODE FOR EMBODYING THE INVENTION

First Embodiment

Figure 1:
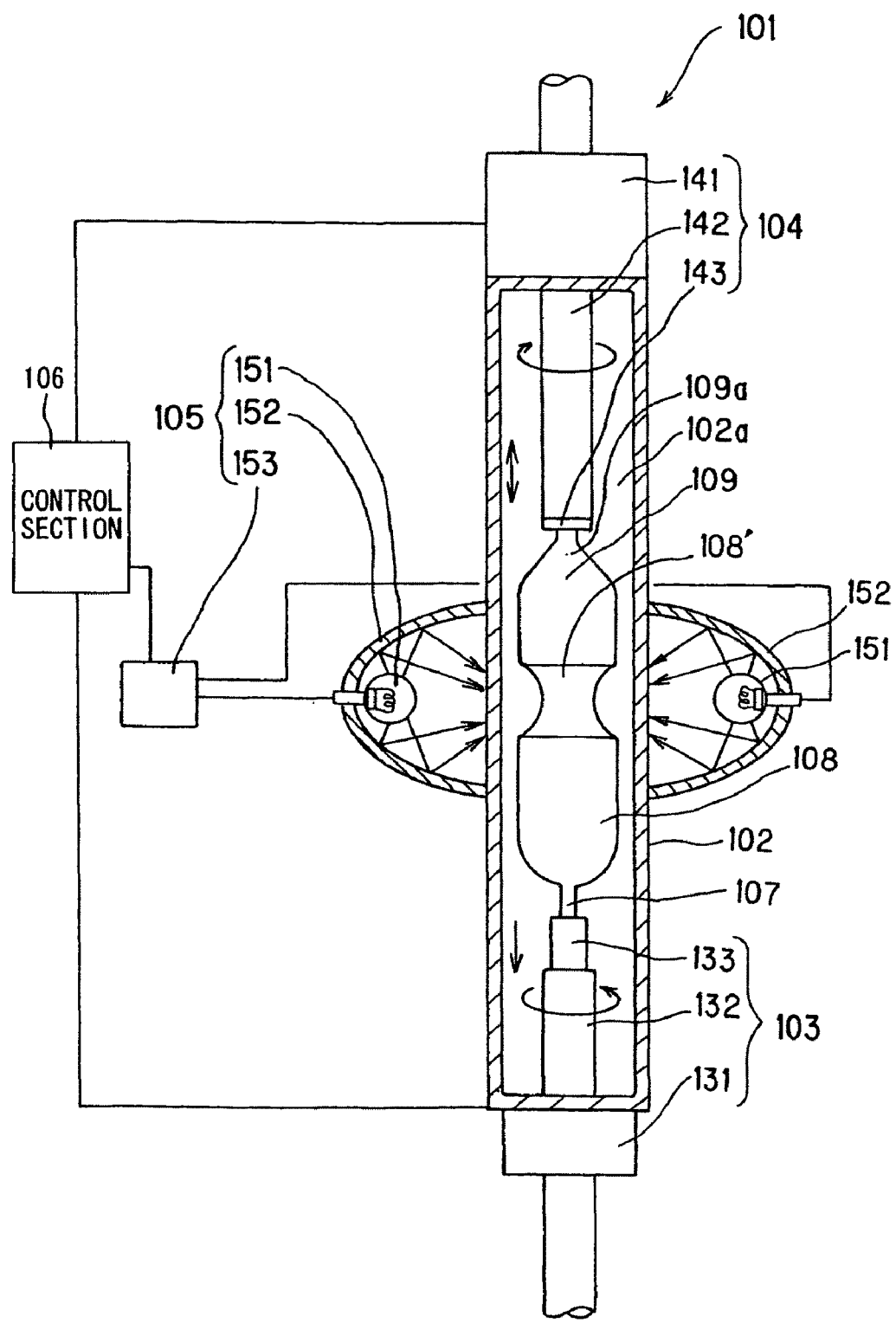
FIG. 1 is a view showing a schematic constitution of infrared heating single crystal manufacturing equipment according to a first embodiment of the present invention.

FIG. 1 shows infrared heating single crystal manufacturing equipment according to the first embodiment of the invention wherein the infrared heating single crystal manufacturing equipment 101 is used for manufacturing a β-Ga$_2$O$_3$ single crystal in accordance with a FZ method, and the equipment is schematically composed of a silica tube 102, a seed rotation section 103 for holding/rotating a β-Ga$_2$O$_3$ seed crystal (hereinafter referred to as "seed crystal") 107, a raw material rotation section 104 for holding/rotating a β-Ga$_2$O$_3$ polycrystalline raw material (hereinafter referred to as simply "polycrystalline raw material") 109, a heating section 105 for heating the polycrystalline raw material 109 to melt it, a seed rotation section 103, and a control section 106 for controlling the raw material rotation section 104 and the heating section 105.

The seed rotation section 103 is provided with a seed chuck 133 for holding the seed crystal 107, a lower rotary shaft 132 for transmitting a rotation to the seed chuck 133, and a lower driving section 131 for rotating normally the lower rotary shaft 132 and moving it vertically at the same time.

The raw material rotation section 104 is provided with a raw material chuck 143 for holding an upper end 109a of the polycrystalline raw material 109, an upper rotary shaft 142 for transmitting a rotation to the raw material chuck 143, and a upper driving section 141 for rotating normally and reversely the upper rotary shaft 142 and moving it vertically at the same time.

The heating section 105 is provided with a halogen lamp 151 for heating diametrically the polycrystalline raw material 109 to melt it, an elliptical mirror 152 for containing the halogen lamp 151 and condensing a light emitted from the halogen lamp 151 in a predetermined region of the polycrystalline raw material 109, and a power supply section 153 for supplying a power source to the halogen lamp 151.

The silica tube 102 contains the lower rotary shaft 132, the seed chuck 133, the upper rotary shaft 142, the raw material chuck 143, the polycrystalline raw material 109, the β-Ga$_2$O$_3$ single crystal 108, and the seed crystal 107. The silica tube 102 to which a mixed gas consisting of oxygen gas and nitrogen gas as an inert gas is supplied, and which may be sealed hermetically.

In the following, a method for growing a β-Ga$_2$O$_3$ single crystal according to the first embodiment of the invention will be described by referring to FIG. 2, FIG. 3, and FIG. 4.

(1) Fabrication of a Seed Crystal

Figure 2:
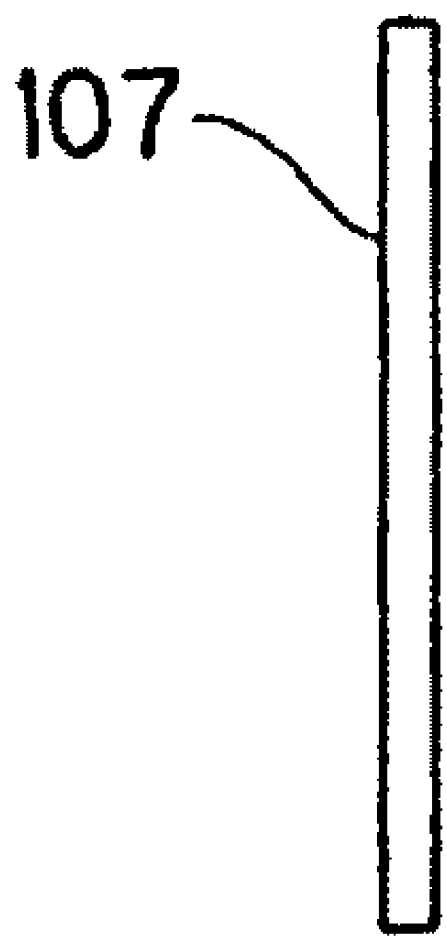
FIG. 2 is a front view showing a seed crystal of β-Ga$_2$O$_3$ according to the first embodiment of the invention.

FIG. 2 is a front view showing the seed crystal 107 wherein the seed crystal 107 is a rectangular column having a square section, and a part of the seed crystal 107 is held by the seed chuck 133. For the seed crystal 107, for example, a material prepared by cutting a β-Ga$_2$O$_3$ single crystal out along the cleavage plane is used. For the sake of growing a good β-Ga$_2$O$_3$ single crystal, the seed crystal 107 has a diameter being one-fifth or less than that of its grown crystal, or a sectional area being 5 mm$^2$ or less than that of the grown crystal, and exhibits a strength due to which the β-Ga$_2$O$_3$ single crystal does not fracture in case of the growing process. In the present embodiment, a sectional area is 1 to 2 mm$^2$. An axial direction of which is the a-axis <100> direction, the b-axis <010> direction, or the c-axis direction <001> direction. It is to be noted herein that a term "diameter" means a side of a square, a long side of a rectangle, or a diameter of a circle. It is desirable that a margin of error between an axial direction and each direction is within plus or minus 10°.

Figure 4:
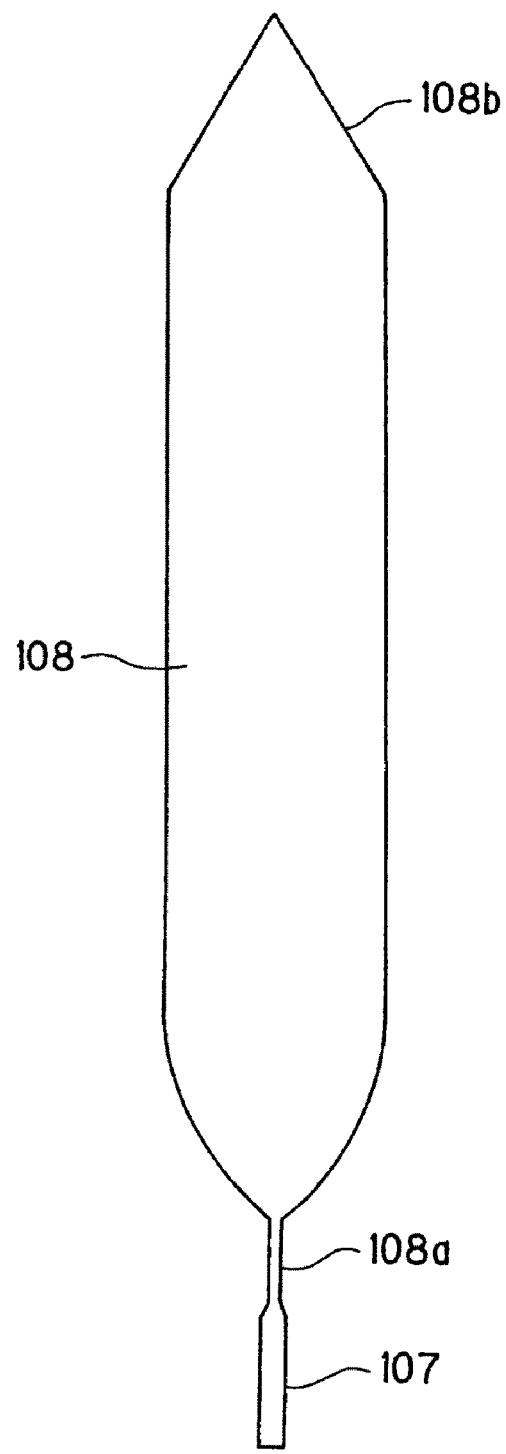
FIG. 4 is a view showing the single crystal according to the first embodiment of the invention.

FIGS. 3(a) through 3(d) show growth processes of the β-Ga$_2$O$_3$ single crystal according to the first embodiment of the invention, and FIG. 4 shows the single crystal according to the first embodiment of the invention wherein the seed chuck 133 is omitted in FIGS. 3(a) to 3(d) and FIG. 4, respectively.

(2) Fabrication of the Polycrystalline Raw Material 109

First, the polycrystalline raw material is fabricated as described hereunder. Namely, a rubber tube (not shown) is charged with a predetermined amount of a Ga$_2$O$_3$ powder having 4N purity, and is subjected to cold compression in 500 MPa. Thereafter, the resulting product is sintered at 1500° C. for 10 hours to obtain the polycrystalline raw material 109 being in a rod-shaped.

(3) Fabrication of the β-Ga$_2$O$_3$ Single Crystal 108

Next, as shown in FIG. 1, a part of the seed crystal 107 is held by the seed chuck 133, while the upper end 109a of the rod-like polycrystalline raw material 109 is held by the raw material chuck 143. Then, as shown in FIG. 3(a), the upper end 107a of the seed crystal 107 is allowed to be in contact with the lower end 109a of the polycrystalline raw material 109 by adjusting a position of the upper rotary shaft 142 in the vertical direction. Furthermore, positions of the upper rotary shaft 142 and the lower rotary shaft 132 are adjusted in the vertical direction in such that a light of the halogen lamp 151 is converged on a region composed of the upper end 107a of the seed crystal 107 and a lower end 109b of the polycrystalline raw material 109. An atmosphere 102a of the silica tube 102 is a mixed gas of nitrogen and oxygen (a ratio of which varies between 100% nitrogen and 100% oxygen) filled in a full pressure of 1 to 2 atmospheric pressure.

When an operator turns on a power switch (not shown), the control section 106 controls respective sections in accordance with a control program to conduct a single crystal growth control. When the heating section 105 is powered on, the halogen lamp 151 heats the region composed of the upper end 107a of the seed crystal 107 and the lower end 109b of the polycrystalline raw material 109 to melt the region to be heated thereby forming a molten drop 108c. In this case, only the seed crystal 107 is rotated.

Then, a contact region of the polycrystalline raw material 109 and the seed crystal 107 is molten while rotating them reversely to each other in such that the polycrystalline raw material 109 becomes compatible sufficiently with the seed crystal 107. As shown in FIG. 3(b), when a moderate β-Ga$_2$O$_3$ single crystal melt 108' is obtained, the rotation of the polycrystalline raw material 109 is stopped, only the seed crystal 107 is rotated, and the polycrystalline raw material 109 and the seed crystal 107 are pulled towards the opposite directions with each other to form a dash neck 108a thinner than the seed crystal 107.

Then, the seed crystal 107 and the polycrystalline raw material 109 are heated by the halogen lamp 151 while rotating them reversely to each other at 20 rpm, and the polycrystalline raw material 109 is pulled upwards by the upper rotary shaft 142 at a ratio of 5 mm/hour. When the polycrystalline raw material 109 is heated by the halogen lamp 151, the polycrystalline raw material 109 is molten to form the melt 108', and when it is cooled, the β-Ga$_2$O$_3$ single crystal 108 having a diameter equal to or smaller than that of the polycrystalline raw material 109 is produced as shown in FIG. 3(c). After forming a single crystal of a moderate length, a diameter of the upper part 108b of the β-Ga$_2$O$_3$ single crystal 108 is reduced for taking out the produced β-Ga$_2$O$_3$ single crystal 108 as shown in FIG. 3(d).

(4) Fabrication of a Substrate

Figure 5:
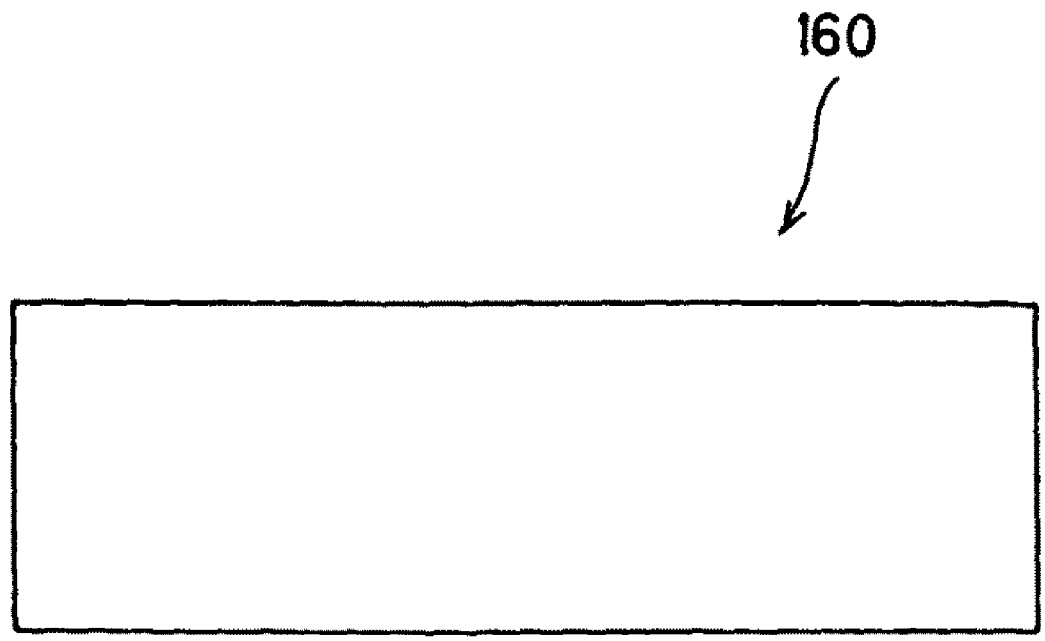
FIG. 5 is a view showing a substrate formed from the β-Ga$_2$O$_3$ single crystal according to the first embodiment of the invention.

FIG. 5 shows a substrate formed from the β-Ga$_2$O$_3$ single crystal 108. When the β-Ga$_2$O$_3$ single crystal 108 is subjected to crystal growth in the b-axis <010> direction, cleavage in the (100) plane becomes stronger, so that a substrate 160 is fabricated by cutting the single crystal in planes parallel to and perpendicular to the (100) plane. When the β-Ga$_2$O$_3$ single crystal 108 is subjected to crystal growth in the a-axis <100> direction and the c-axis <001> direction, cleavage in the (100) plane and the (001) plane become weakened, so that a workability in all the planes becomes good, whereby there is no limitation as to planes to be cut out as described above.

Figure 6:
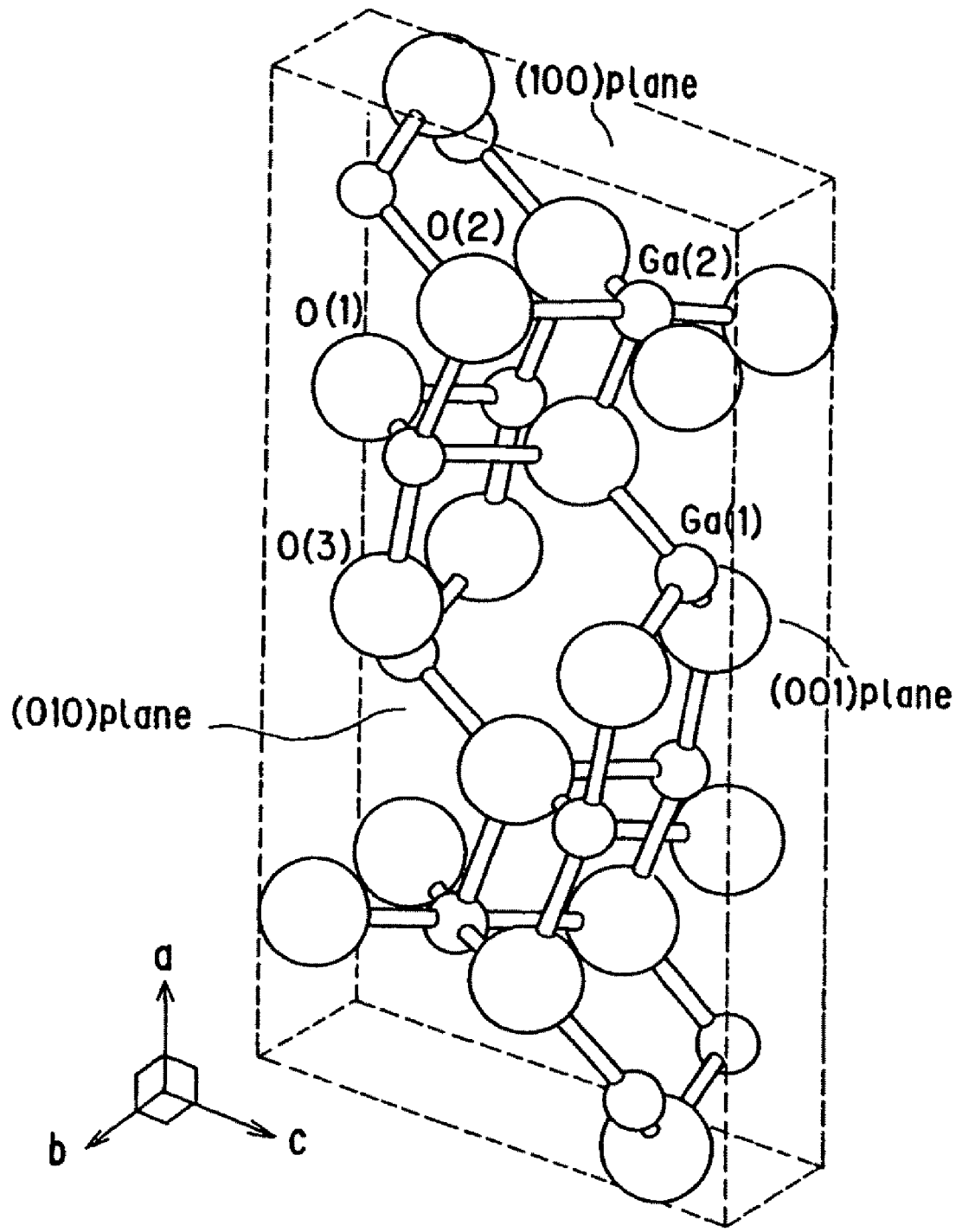
FIG. 6 is a view showing a unit cell of the β-Ga$_2$O$_3$ single crystal according to the first embodiment of the invention.

FIG. 6 shows a unit cell of the $\beta$-$Ga_2O_3$ single crystal. The $\beta$-$Ga_2O_3$ single crystal is composed of eight Ga atoms and twelve O atoms wherein there are represented by Ga (1), Ga (2), O (1), O (2), and O (3). In the figure, reference characters a, b, and c indicate the a-axis <100> direction, the b-axis <010> direction, and the c-axis <001> direction, respectively.

According to the first embodiment, the following advantages are obtained.

(a) Since a crystal is grown in a predetermined direction, a large $\beta$-$Ga_2O_3$ single crystal 108 can be obtained.

(b) When the a-axis <100> direction, the b-axis <010> direction, or the c-axis <001> direction is selected to be its crystal axis, cracking and twinning tendencies decrease, whereby high crystallinity is obtained.

(c) In addition, such crystal as mentioned above may be obtained with a good reproducibility, so that it has a high utility value as a substrate for a semiconductor and the like.

The present invention is not restricted to the above-described embodiment, but it is applicable for a variety of modifications.

For instance, in place of the $\beta$-$Ga_2O_3$ seed crystal 107, a $\beta$-$Ga_2O_3$ seed crystal being in the same monoclinic system as $\beta$-$Ga_2O_3$, a space group thereof belongs to C2/m, and composed of a $\beta$-$Ga_2O_3$ solid solution containing an oxide (oxides) of one, two or more of elements selected from the group consisting of gallium, indium, aluminum, tin, germanium, nickel, copper, zinc, zirconium, niobium, molybdenum, titanium, vanadium, chromium, manganese, iron, cobalt, hafnium, tantalum, tungsten, silicon, and magnesium may be used to grow a $\beta$-$Ga_2O_3$ single crystal made of such solid solution. Thus, a LED emitting a light in a wavelength band extending from ultraviolet to blue can be realized.

Moreover, when the FZ method is carried out by the use of a mixed gas of nitrogen and oxygen in a full pressure of 2 atmospheric pressures or more, a generation of bubbles can be suppressed, whereby the crystal growth processes can be more stabilized.

In case of requiring pulling upwards the single crystal 108, the lower rotary shaft 132 may be lowered. The halogen lamp 151 is not transferred, but the lower rotary shaft 132 and the upper rotary shaft 142 may be transferred to perform a heat treatment. Furthermore, a heating coil may be used for heating in place of the halogen lamp 151.

In the present embodiment, although nitrogen gas is used for the inert gas, argon may be used in place of the nitrogen gas in the present invention.

The seed crystal 107 may have a rectangular section, and a columnar or a cylindroidal seed crystal may be applied.

Although the present embodiment has been described with respect to the FZ method, the other crystal growth methods such as EFG method (which is a shape control crystal growth method utilizing Czochralski method being a pulling method) is also applicable.

Second Embodiment

Figure 7:
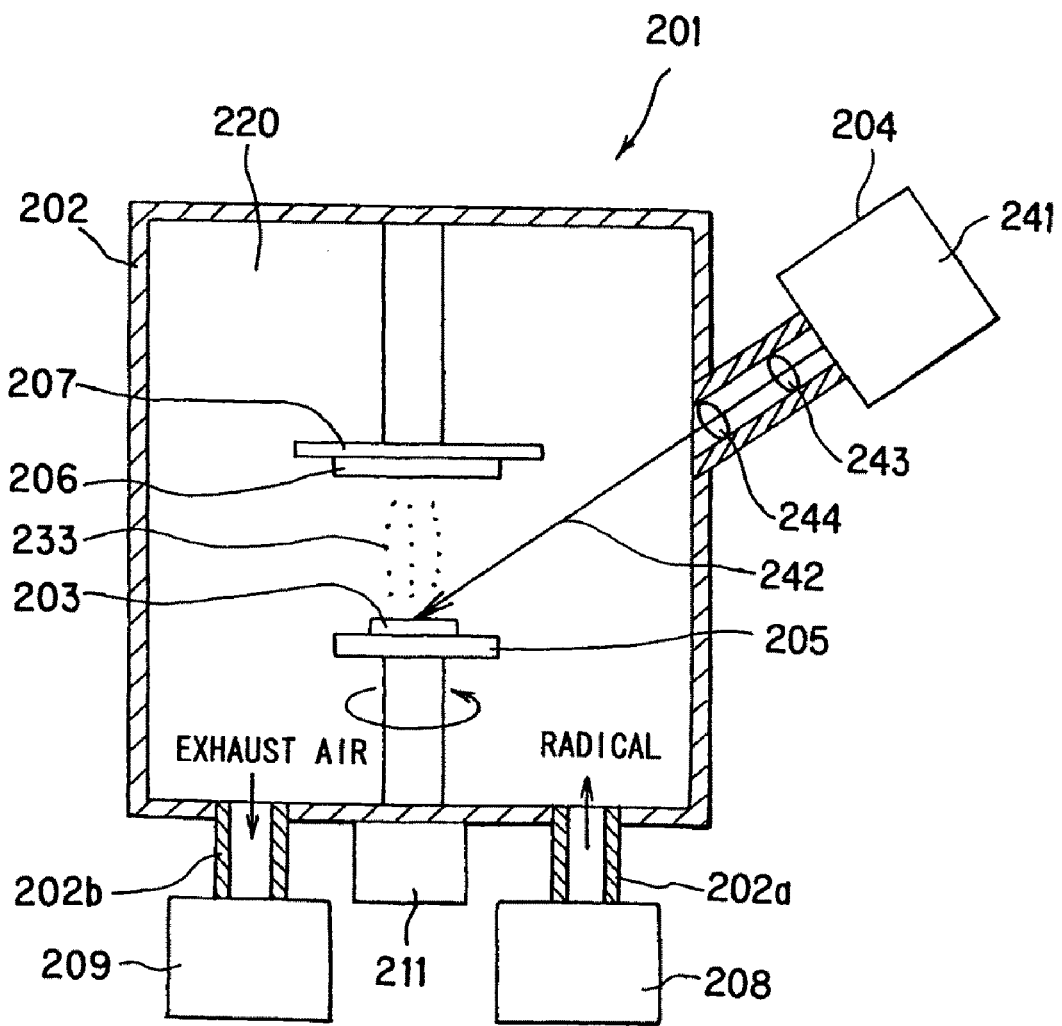
FIG. 7 is a view showing a schematic constitution of film formation equipment according to a second embodiment of the invention.

FIG. 7 shows a schematic constitution of film formation equipment according to a second embodiment of the invention. The film formation equipment 201 performs the film formation in accordance with PLD method and which is provided with a chamber 202 containing a space 220 which can be evacuated, a target table 205 placed in the chamber 202, a target 203 being maintained on the target table, a rotation mechanism 211 placed outside the chamber 202 and for rotating the target table 205, a substrate holding section 207 placed inside the chamber 202 and for holding a substrate 206, a heater which can heat the substrate 206 up to 1500° C. being housed in the substrate holding section, a radical injection section 208 for injecting radicals into the chamber 202 through a pipe 202a, an exhaust section 209 having a vacuum pump (not shown) for exhausting the space 220 through a pipe 202b to evacuate the space 220, and a laser section 204 provided outside the chamber 202 and for irradiating a laser beam as an excitation beam to the target 203.

The target 203 is made from a pure metal or an alloy, for example, an alloy containing a high-purity Ga or Ga.

The laser section 204 is provided with a laser oscillation section 241 for irradiating a laser beam 242 in a pulsed manner and employing Nd:YAG laser, KrF excimer laser, ArF excimer laser and the like as a laser source, and lenses 243 and 244 for condensing the laser beam 242 output from the laser oscillation section 241 on the target 203.

The substrate 206 is opposed to the target 203 in such that chemical species such as metal atoms 233 dissociated from the target 203 at the time when the laser beam 242 is irradiated on the target 203 can make contribution to a film formation.

The radical injection section 208 is arranged to inject one, two or more of a gas (gases) selected from oxygen gas, oxygen gas containing ozone, pure ozone gas, $N_2O$ gas, $NO_2$ gas, oxygen gas containing oxygen radicals, oxygen radicals, nitrogen radicals, $NH_3$ gas, $NH_3$ gas containing nitrogen radicals and the like, in other words, a gas to be combined with atoms released from the target 203 at the time of a film formation into the space 220.

Next, a method for growing a thin-film single crystal according to the second embodiment will be described. The growth method is composed of a process for preparing the substrate 206 on which a thin film is grown, and a process for growing the thin film on the substrate 206. A case where a thin film made of $\beta$-$Ga_2O_3$ is formed on the substrate 206 made of $\beta$-$Ga_2O_3$ is described herein.

(1) Preparation of the Substrate 206

First, a $\beta$-$Ga_2O_3$ single crystal is formed in accordance with FZ (Floating Zone) method. More specifically, a $\beta$-$Ga_2O_3$ seed crystal and a $\beta$-$Ga_2O_3$ polycrystalline raw material are molten at a contact region thereof in a silica tube. When the molten $\beta$-$Ga_2O_3$ polycrystalline raw material is lowered together with the $\beta$-$Ga_2O_3$ seed crystal, a $\beta$-$Ga_2O_3$ single crystal is formed on the $\beta$-$Ga_2O_3$ seed crystal. Thereafter, the substrate 206 is fabricated from the $\beta$-$Ga_2O_3$ single crystal. In case of a crystal growth in the b-axis <010> direction, cleavage in the (100) plane becomes strong, so that the substrate 206 is fabricated by cutting out the resulting crystal with a plane parallel to and a plane perpendicular to the (100) plane, respectively. In case of crystal growth in the a-axis <100> direction or the c-axis <001> direction, the cleavage in the (100) plane and the (001) plane becomes weakened, so that workability in all the planes is elevated, whereby no limitation as to a plane to be cut out unlike the case as described above.

(2) Growth of a Thin Film

A thin film is formed on the substrate 206 by using the above-mentioned film formation equipment 201. Namely, as the target 203, for example, a target 203 made of Ga is fixed to the target table 205. The substrate 206 made of a $\beta$-$Ga_2O_3$ single crystal is held by the substrate holding section 207. Air in the space 220 is exhausted by means of the vacuum pump contained in the exhaust section 209 to be a degree of vacuum in the space 220 of, for example, around $1\times10^{-9}$ torr, then, for example, oxygen gas is injected into the space 220 to be a degree of vacuum of around 1×10⁻⁷ torr, and the substrate 206 is heated at a temperature of 300° C. to 1500° C. by energizing a heater (not shown) by means of the substrate holding section 207. Thereafter, oxygen radicals are injected by the radical injection section 208 into the space 220 to be a degree of vacuum of 1×10⁻⁴ to 1×10⁻⁶ torr. When the laser beam 242 of 266 nm wavelength is irradiated from the laser section 204 with a laser output of 100 mW at a repetition frequency of 10 Hz on the target 203 rotated by the rotation mechanism 211, Ga atoms constituting the target 203 are excited, so that chemical species such as Ga atoms, Ga ions, excited Ga atoms, and excited Ga ions released from the target 203 combine with the oxygen radicals in the atmosphere on the substrate 206 due to thermal and photochemical actions, whereby the β-Ga₂O₃ single crystal is formed. The formed β-Ga₂O₃ single crystal grows on the substrate 206, whereby a β-Ga₂O₃ thin-film single crystal is formed on the substrate 206. In this case, the grown β-Ga₂O₃ thin-film single crystal exhibits n-type conductivity, and this conductivity is considered to be due to oxygen defect.

According to the second embodiment, since chemical species such as metallic atoms, metallic ions, excited metallic atoms, and excited metallic ions released from the target 203 are combined with atoms in its atmosphere, a surface flatness is high, and a thin film made of a β-Ga₂O₃ single crystal of a good quality can be grown on a substrate.

Third Embodiment

Figure 8:
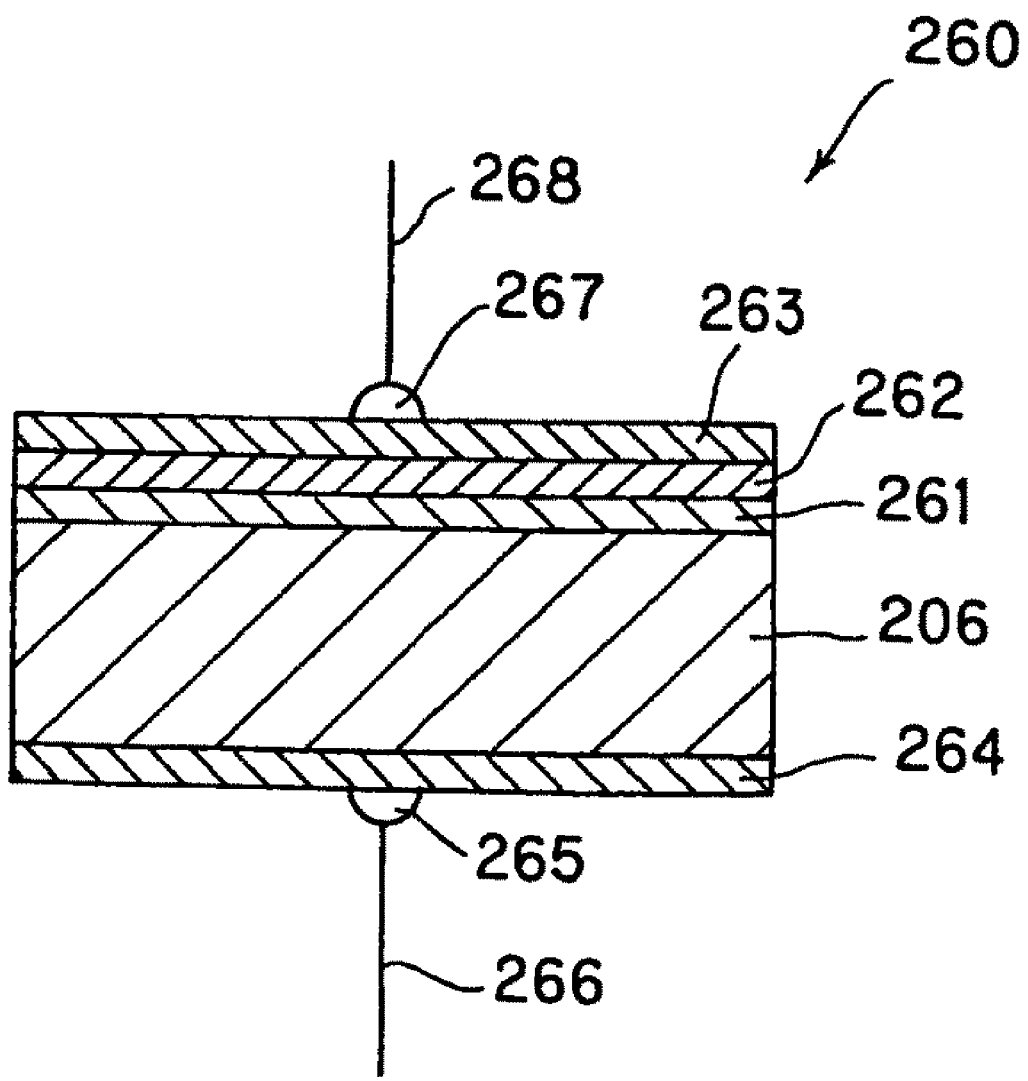
FIG. 8 is a view showing a section of a MIS type light-emitting device according to a third embodiment of the invention.

FIG. 8 shows a section of a MIS type light-emitting device according to a third embodiment of the present invention. The MIS type light-emitting device 260 is provided with a substrate 206 made of a β-Ga₂O₃ single crystal, a β-Ga₂O₃ thin-film single crystal 261 exhibiting an n-type conductivity and formed on the top of the substrate 206, an insulation layer 262 made of a β-Ga₂O₃ thin-film crystal and formed on the top of the n-type β-Ga₂O₃ thin-film single crystal 261, a gold electrode 263 formed on the top of the insulation layer 262, a bonding 267 attached on the top of the gold electrode 263 and to which a lead 268 is connected, an n-electrode 264 formed on the bottom of the substrate 206, and a bonding 265 attached to the bottom of the n-electrode 264 and to which a lead 266 is connected.

The insulation layer 262 is formed by annealing the β-Ga₂O₃ crystal at 900° C. in an oxygen atmosphere with no oxygen defect in the surface of 10 to 1000 nm.

According to the third embodiment, a light-emitting device having an emission wavelength of the vicinities of 260 nm is obtained.

Fourth Embodiment

A ZnO thin-film single crystal according to a fourth embodiment of the present invention is obtained by employing the film formation equipment 201 according to the second embodiment, using a metal of Zn or an alloy containing Zn as a target 203, and growing a thin film on a substrate 206.

According to the fourth embodiment, when an excitation beam is irradiated on the metallic target 203 made of Zn or an alloy containing Zn, Zn atoms or the other atoms constituting the metallic target 203 are excited, so that chemical species such as Zn atoms, Zn ions, excited Zn atoms, and excited Zn ions released from the metallic target 203 due to thermal and photochemical actions combine with radicals in its atmosphere, and the so combined product grows on the substrate 206 to form a ZnO thin-film single crystal.

Alternatively, a buffer layer made of a ZnO thin-film crystal may be grown on a substrate made of a β-Ga₂O₃ single crystal, and a ZnO thin-film single crystal is formed on the buffer layer. According to this constitution, since the same type of a ZnO thin-film single crystal as that of the buffer layer is formed on the buffer layer, lattice mismatch decreases, so that the ZnO thin-film single crystal having good crystallinity can be formed.

Fifth Embodiment

A GaN thin-film single crystal according to a fifth embodiment of the present invention is obtained by employing the film formation equipment 201 according to the second embodiment, using one, two or more of a gas (gases) of nitrogen radicals, NH₃ gas, and NH₃ gas containing the nitrogen radicals as its atmosphere, and growing a thin film on a substrate 206.

According to the fifth embodiment, when an excitation beam is irradiated on the metallic target 203 made of Ga or an alloy containing Ga, Ga atoms or the other atoms constituting the metallic target 203 are excited, so that chemical species such as Ga atoms, Ga ions, excited Ga atoms, and excited Ga ions released from the metallic target 203 due to thermal and photochemical actions combine with radicals in its atmosphere, and the so combined product grows on the substrate 206 to form a GaN thin-film single crystal.

Alternatively, a buffer layer made of a GaN thin-film crystal may be grown on a substrate 206 made of a β-Ga₂O₃ single crystal, and a GaN thin-film single crystal is formed on the buffer layer. According to this constitution, since the same type of a GaN thin-film single crystal as that of the buffer layer is formed on the buffer layer, lattice mismatch decreases, so that the GaN thin-film single crystal having good crystallinity can be formed.

Sixth Embodiment

A β-Ga₂O₃ thin film according to the sixth embodiment of the invention is obtained by such a manner that the film formation equipment 201 according to the second embodiment is used, Ga is used for a material of a target 203, a substrate 206 made of β-Ga₂O₃ is used, and a laser beam 242 having 266 nm wavelength is irradiated on the target 203 while injecting oxygen radicals wherein a substrate temperature is 400° C., a laser output is 100 mW, a repetition frequency is 10 Hz, and a degree of vacuum is 1×10⁻⁵ torr.

The laser oscillation section 241 adopts 1.064 μm corresponding to an oscillation wavelength of Qsw Nd:YAG laser as the fundamental wave, and which is possible to make pulse oscillation of 355 nm being third harmonics and 266 nm being fourth harmonics by the use of a nonlinear optical crystal (not shown). After irradiating the laser beam 242, a colorless and transparent β-Ga₂O₃ thin film is grown on a β-Ga₂O₃ substrate 206.

Figure 9:
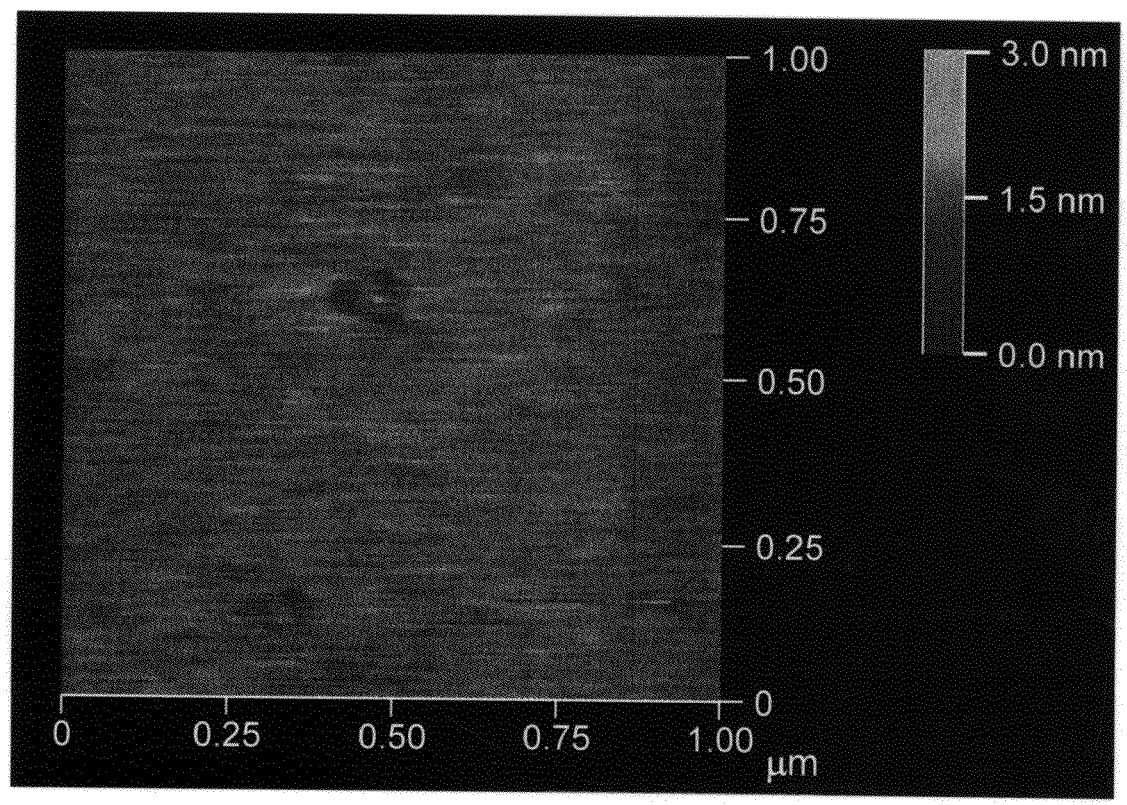
FIG. 9 is a view showing an atomic force microgram (AFM) of a β-Ga$_2$O$_3$ thin film according to a sixth embodiment of the invention.

FIG. 9 shows an atomic force microgram (AFM) of a β-Ga₂O₃ thin film according to the sixth embodiment. According to the microgram, it exhibits that a surface of the β-Ga₂O₃ thin film has a high flatness, and the thin film has high quality.

According the sixth embodiment, when an excitation beam is irradiated on the target made of Ga, Ga atoms are excited from the target, chemical species such as Ga atoms released from the target due to thermal and photochemical actions combine with oxygen radicals in its atmosphere, and the so combined product grows on the substrate, whereby a colorless and transparent β-Ga$_2$O$_3$ thin-film single crystal with high quality can be formed on the substrate made of β-Ga$_2$O$_3$.

Seventh Embodiment

A β-Ga$_2$O$_3$ thin film according to a seventh embodiment of the present invention may be prepared in the same conditions as that of the sixth embodiment except that a substrate temperature is 1000° C.

Figure 10:
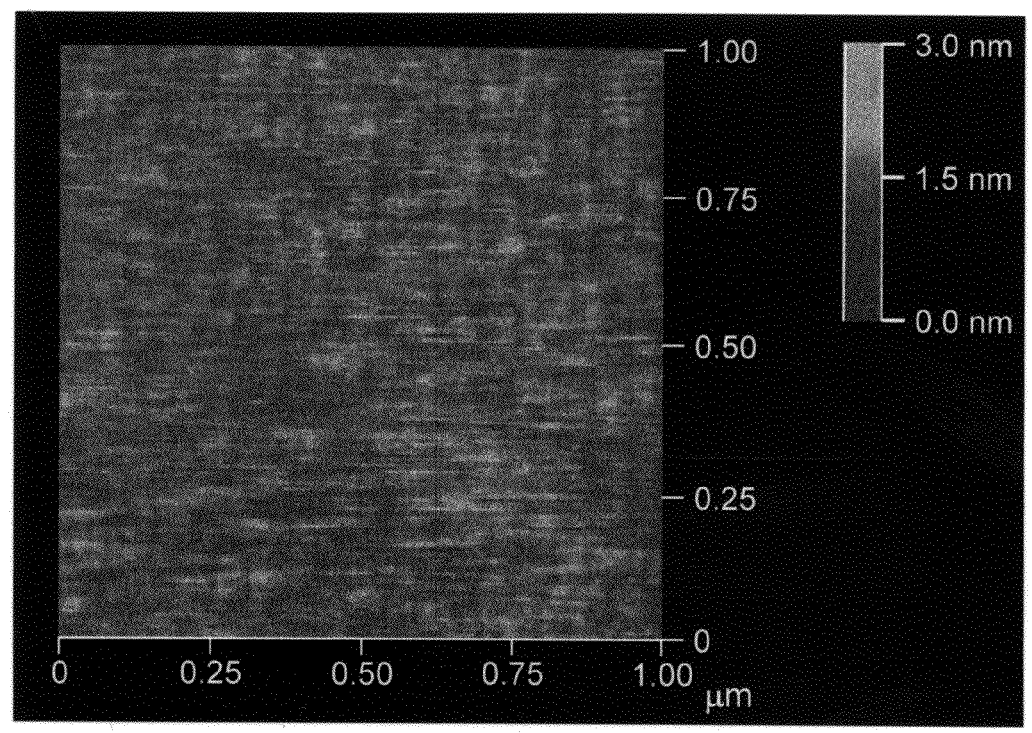
FIG. 10 is a view showing an atomic force microgram (AFM) of a β-Ga$_2$O$_3$ thin film according to a seventh embodiment of the invention.

FIG. 10 shows an atomic force microgram (AFM) of a β-Ga$_2$O$_3$ thin film according to the seventh embodiment. According to the microgram, it exhibits that a surface of the β-Ga$_2$O$_3$ thin film has a high flatness, and the thin film has high quality.

Figure 11:
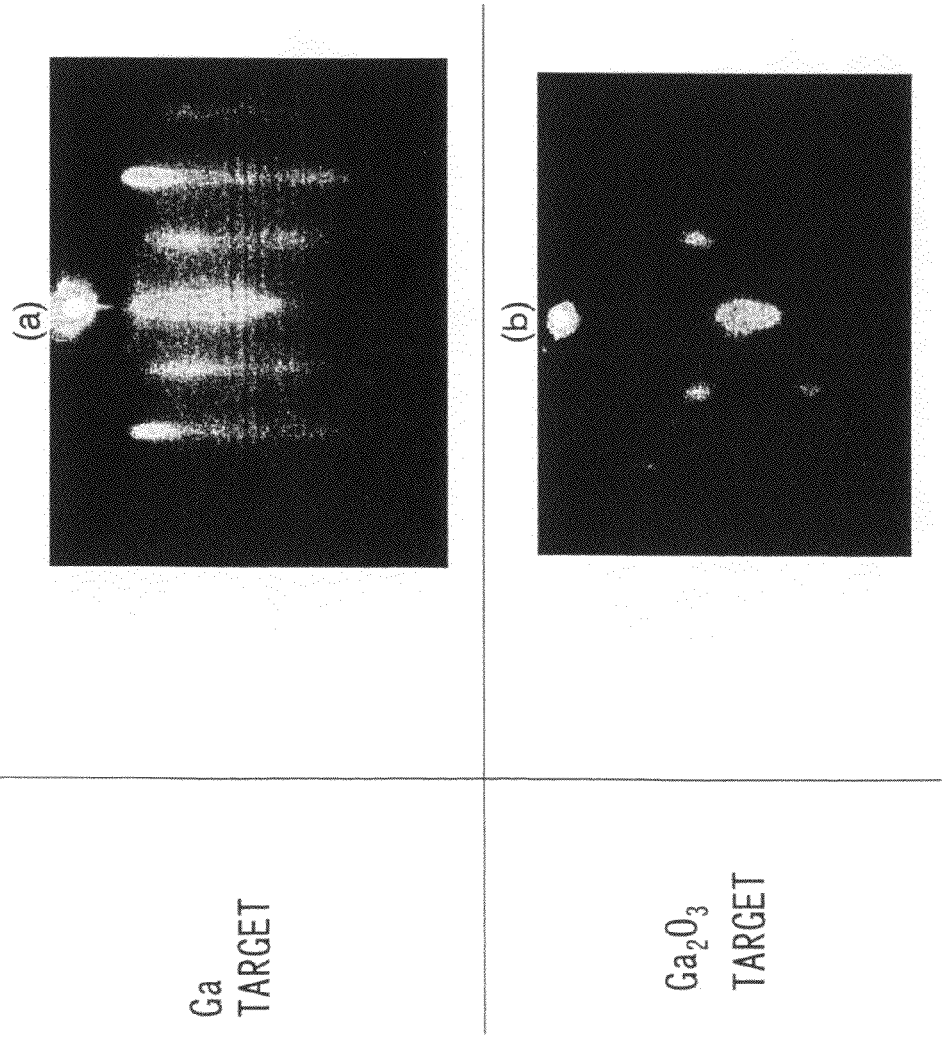
FIGS. 11($a$) and 11($b$) are comparative views showing reflection high energy electron diffraction (RHEED) patterns of the β-Ga$_2$O$_3$ thin film according to the seventh embodiment of the invention and a thin film of a comparative example corresponding to that of the seventh embodiment wherein FIG. 11($a$) shows the reflection high energy electron diffraction pattern of the β-Ga$_2$O$_3$ thin film according to the seventh embodiment of the invention, while FIG. 11($b$) shows the thin film of the comparative example corresponding to that of the seventh embodiment.

FIG. 11(a) shows a reflection high energy electron diffraction (RHEED) pattern of a β-Ga$_2$O$_3$ thin film according to the seventh embodiment, while FIG. 11(b) shows a pattern of a reflection high energy electron diffraction of a thin film according to a comparative example corresponding to the seventh embodiment which will be mentioned later. As is apparent from FIG. 11(a), it is found that a β-Ga$_2$O$_3$ thin-film single crystal with high quality is grown.

According the seventh embodiment, when an excitation beam is irradiated on the target made of Ga, Ga atoms are excited from the target, chemical species such as Ga atoms released from the target due to thermal and photochemical actions combine with oxygen radicals in its atmosphere, and the so combined product grows on the substrate, whereby a colorless and transparent β-Ga$_2$O$_3$ thin-film single crystal with good quality can be formed on the substrate 206 made of β-Ga$_2$O$_3$.

Comparative Example Corresponding to the Seventh Embodiment

A β-Ga$_2$O$_3$ thin film according to the comparative example is obtained on a β-Ga$_2$O$_3$ substrate 206 by such a manner that the film formation equipment 201 according to the second embodiment is used, Ga$_2$O$_3$ is used for a material of a target 203, the substrate 206 made of β-Ga$_2$O$_3$ is used, and a laser beam 242 having 266 nm wavelength is irradiated on the target 203 under an oxygen radical atmosphere wherein a substrate temperature is 1000° C., a laser output is 100 mW, a repetition frequency is 10 Hz, and a degree of vacuum is 1×10$^{-5}$ torr. The resulting β-Ga$_2$O$_3$ thin film is transparent.

FIG. 11(b) shows a pattern of a reflection high energy electron diffraction of a grown β-Ga$_2$O$_3$ thin film. As is apparent from FIG. 11(b), a good β-Ga$_2$O$_3$ thin-film single crystal is not grown.

According to the comparative example, when a target made of Ga$_2$O$_3$ is used, a good thin-film single crystal is not produced. From the result, it is found that a target made of Ga is suitable for growth of thin-film single crystal. Furthermore, as is understood from FIGS. 11(a) and 11(b), a presence of oxygen radicals is effective for growing a β-Ga$_2$O$_3$ thin-film single crystal on the substrate 206 made of β-Ga$_2$O$_3$ in addition to the target made of Ga.

Eighth Embodiment

A β-Ga$_2$O$_3$ thin film according to the eighth embodiment of the invention is obtained by such a manner that the film formation equipment 201 according to the second embodiment is used, Ga is used for a material of a target 203, a substrate 206 made of β-Ga$_2$O$_3$ is used, and a laser beam 242 having 266 nm wavelength is irradiated on the target 203 while injecting N$_2$O radicals wherein a substrate temperature is 1000° C., a laser output is 100 mW, a repetition frequency is 10 Hz, and a degree of vacuum is 1×10$^{-5}$ torr.

Figure 12:
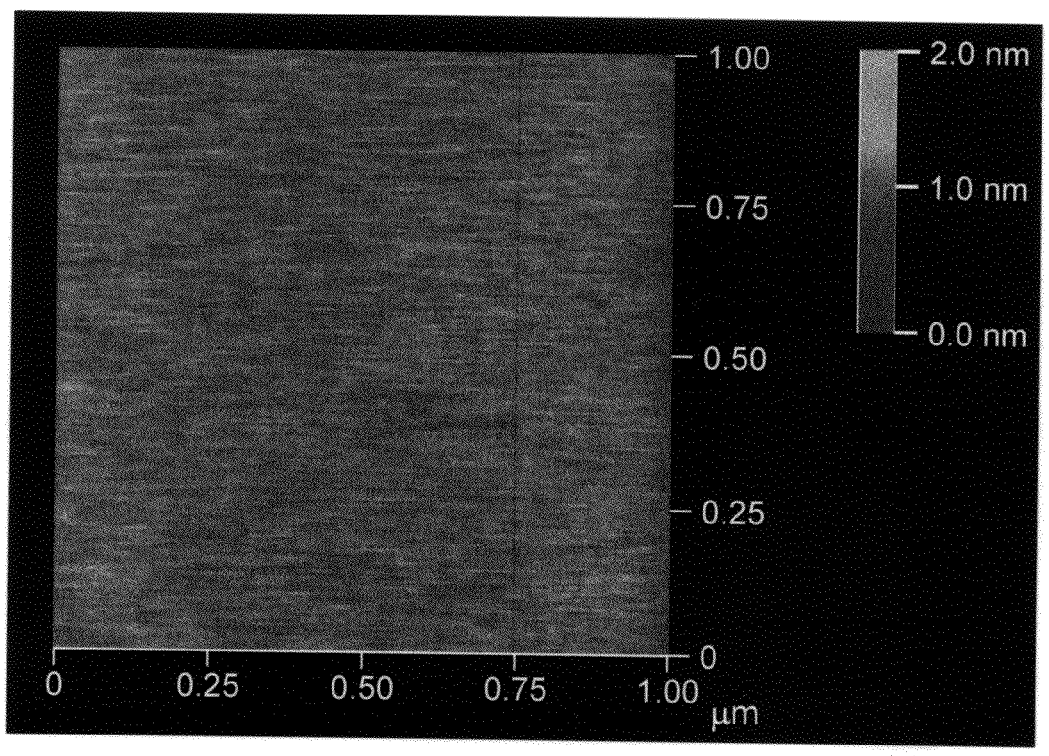
FIG. 12 is a view showing an atomic force microgram of a β-Ga$_2$O$_3$ thin film according to an eighth embodiment of the invention.

FIG. 12 shows an atomic force microgram of the β-Ga$_2$O$_3$ thin film in accordance with the eighth embodiment. According to the microgram, it exhibits that a surface of the β-Ga$_2$O$_3$ thin film has a high flatness, and the thin film has high quality.

Figure 13:
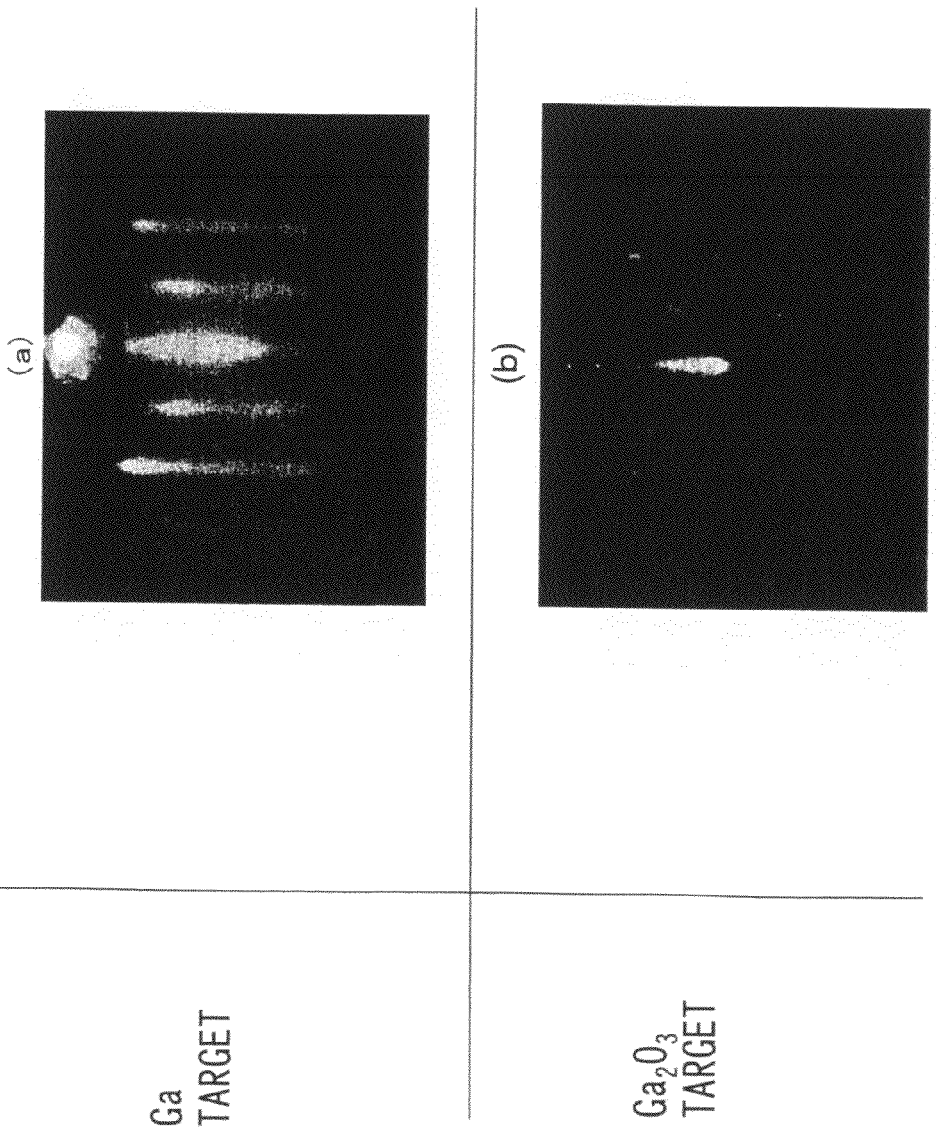
FIGS. 13($a$) and 13($b$) are comparative views showing reflection high energy electron diffraction patterns of the β-Ga$_2$O$_3$ thin film according to the eighth embodiment of the invention and a thin film of a comparative example corresponding to that of the eighth embodiment wherein FIG. 13($a$) shows the reflection high energy electron diffraction pattern of the β-Ga$_2$O$_3$ thin film according to the eighth embodiment of the invention, while FIG. 13($b$) shows the thin film of the comparative example corresponding to that of the eighth embodiment.

FIG. 13(a) shows a reflection high energy electron diffraction pattern of the β-Ga$_2$O$_3$ thin film according to the eighth embodiment, while FIG. 13(b) shows a pattern of a reflection high energy electron diffraction of a thin film according to a comparative example corresponding to the eighth embodiment which will be mentioned later. As is apparent from FIG. 13(a), it is found that a β-Ga$_2$O$_3$ thin-film single crystal with high quality is grown.

According the eighth embodiment, when an excitation beam is irradiated on the target made of Ga, Ga atoms are excited from the target, chemical species such as Ga atoms released from the target due to thermal and photochemical actions combine with N$_2$O radicals in its atmosphere, and the so combined product grows on the substrate, whereby a colorless and transparent β-Ga$_2$O$_3$ thin-film single crystal with good quality can be formed on the substrate 206 made of β-Ga$_2$O$_3$.

Comparative Example Corresponding to the Eighth Embodiment

A β-Ga$_2$O$_3$ thin film according to the comparative example is obtained on a β-Ga$_2$O$_3$ substrate 206 by such a manner that the film formation equipment 201 according to the second embodiment is used, Ga$_2$O$_3$ is used for a material of a target 203, the substrate 206 made of β-Ga$_2$O$_3$ is used, and a laser beam 242 having 266 nm wavelength is irradiated on the target 203 under a N$_2$O radical atmosphere wherein a substrate temperature is 1000° C., a laser output is 100 mW, a repetition frequency is 10 Hz, and a degree of vacuum is 1×10$^{-5}$ torr. The resulting β-Ga$_2$O$_3$ thin film is transparent.

FIG. 13(b) shows a pattern of a reflection high energy electron diffraction of a grown β-Ga$_2$O$_3$ thin film as described above. As is apparent from FIG. 13(b), a good β-Ga$_2$O$_3$ thin-film single crystal is not grown.

According to the comparative example, it is found that a presence of N$_2$O radicals is effective for growing a β-Ga$_2$O$_3$ thin-film single crystal on the substrate 206 made of β-Ga$_2$O$_3$ in addition to the target made of Ga.

Ninth Embodiment

A β-Ga$_2$O$_3$ thin film according to a ninth embodiment of the present invention may be prepared in the same conditions as that of the eighth embodiment except that a substrate temperature is 400° C.

Figure 14:
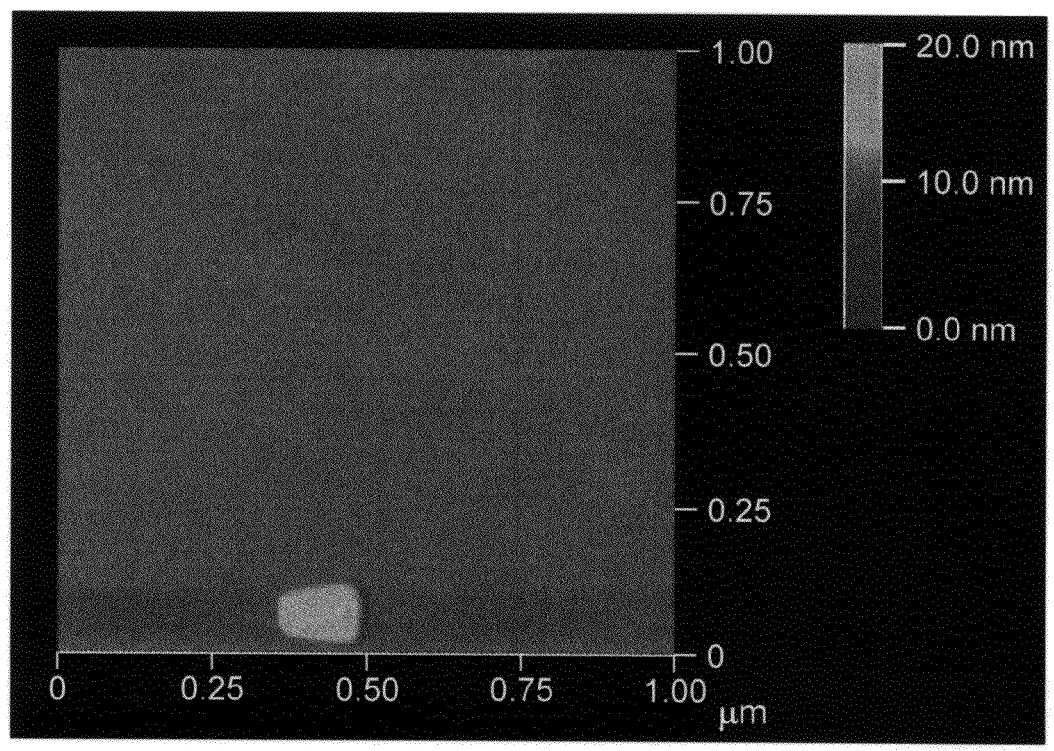
FIG. 14 is a view showing an atomic force microgram of a β-Ga$_2$O$_3$ thin film according to a ninth embodiment of the invention.

FIG. 14 shows an atomic force microgram of a β-Ga$_2$O$_3$ thin film according to the ninth embodiment. According to the microgram, it exhibits that a surface of the β-Ga$_2$O$_3$ thin film has a high flatness, and the thin film has high quality.

According the ninth embodiment, when an excitation beam is irradiated on the target made of Ga, Ga atoms are excited from the target, chemical species such as Ga atoms released from the target due to thermal and photochemical actions combine with N$_2$O radicals in its atmosphere, and the so combined product grows on the substrate, whereby a colorless and transparent β-Ga$_2$O$_3$ thin-film single crystal with good quality can be formed on the substrate 206 made of β-Ga$_2$O$_3$.

Tenth Embodiment

A β-Ga$_2$O$_3$ thin film according to the tenth embodiment of the invention is obtained by such a manner that the film formation equipment 201 according to the second embodiment is used, Ga is used for a material of a target 203, a substrate 206 made of β-$Ga_2O_3$ is used, and a laser beam 242 having 355 nm wavelength is irradiated on the target 203 while injecting oxygen radicals wherein a substrate temperature is 1000° C., a laser output is 100 mW, a repetition frequency is 10 Hz, and a degree of vacuum is 1×$10^{-5}$ torr.

Figure 15:
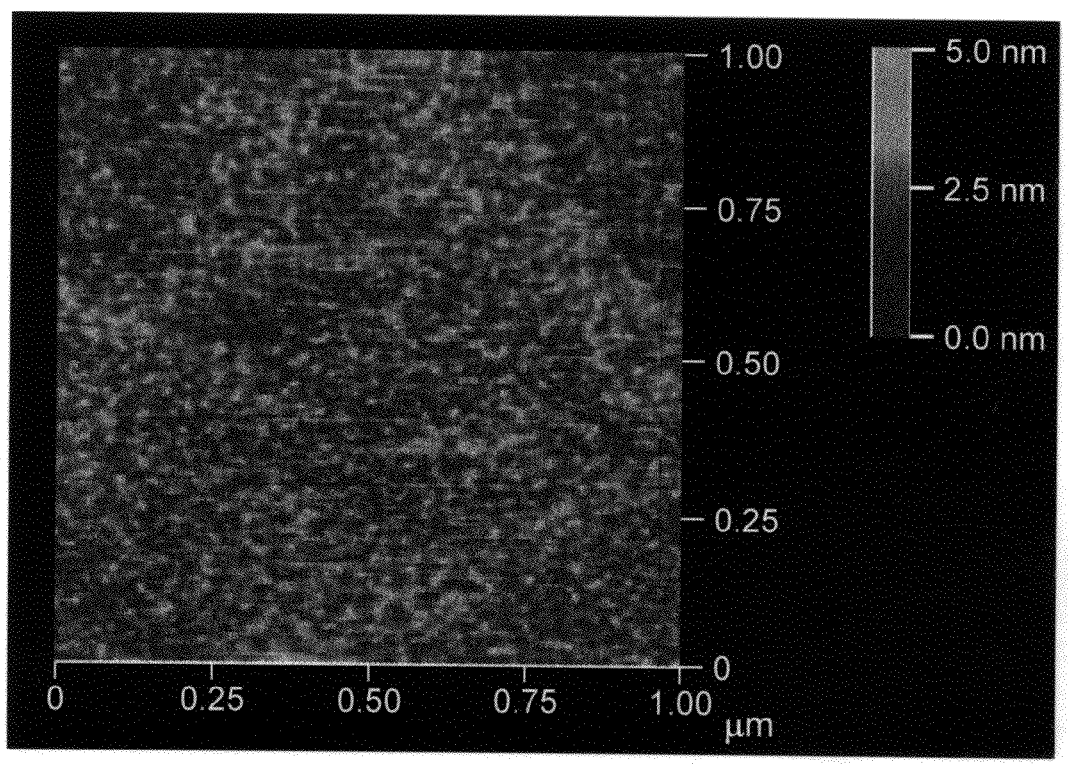
FIG. 15 is a view showing an atomic force microgram of a β-Ga$_2$O$_3$ thin film according to a tenth embodiment of the invention.

FIG. 15 shows an atomic force microgram of the β-$Ga_2O_3$ thin film in accordance with the tenth embodiment. According to the microgram, it exhibits that a surface of the β-$Ga_2O_3$ thin film has a high flatness, and the thin film has high quality.

According the tenth embodiment, when an excitation beam is irradiated on the target made of Ga, Ga atoms are excited from the target, chemical species such as Ga atoms released from the target due to thermal and photochemical actions combine with oxygen radicals in its atmosphere, and the so combined product grows on the substrate, whereby a colorless and transparent β-$Ga_2O_3$ thin-film single crystal with good quality can be formed on the substrate 206 made of β-$Ga_2O_3$.

Comparative Example Corresponding to the Tenth Embodiment

Figure 16:
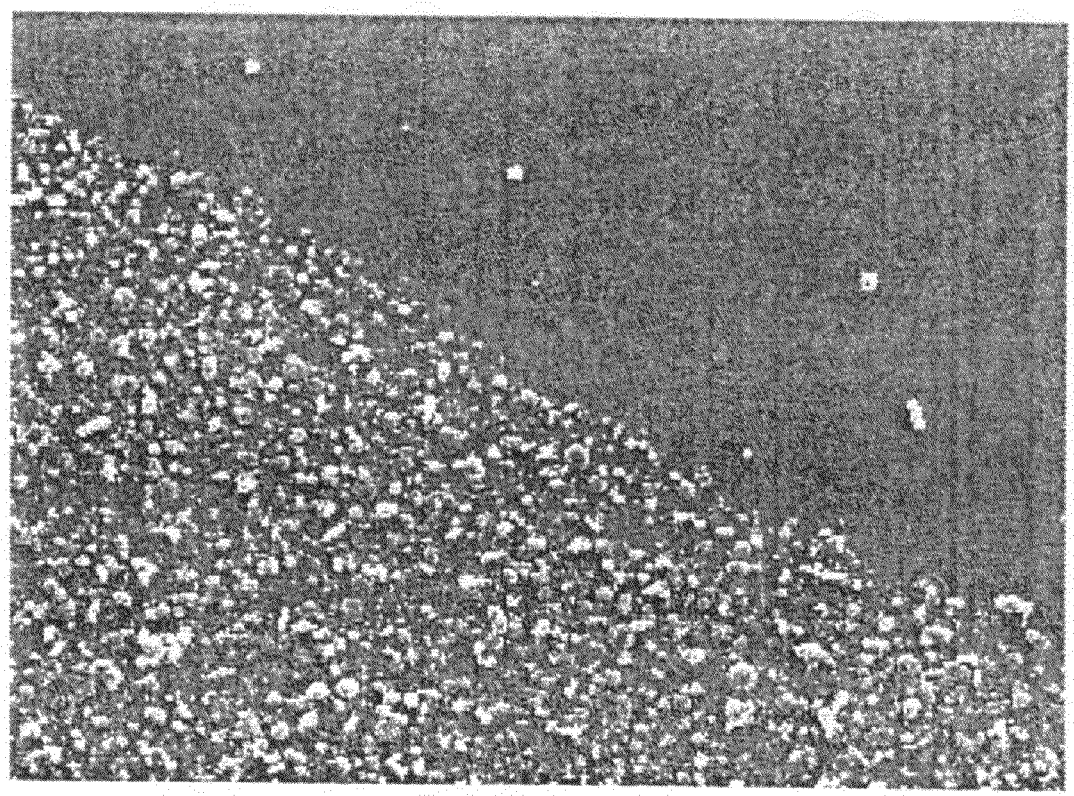
FIG. 16 is a view showing a scanning electron microgram (SEM) of a β-Ga$_2$O$_3$ thin film according to a comparative example corresponding to that of the tenth embodiment of the invention.

FIG. 16 shows a scanning electron microgram (SEM) of a β-$Ga_2O_3$ thin film according to the comparative example corresponding to the tenth embodiment. The β-$Ga_2O_3$ thin film according to the comparative example is obtained on a β-$Ga_2O_3$ substrate 206 by such a manner that the film formation equipment 201 according to the second embodiment is used, $Ga_2O_3$ is used for a material of a target 203, the substrate 206 made of β-$Ga_2O_3$ is used, and a laser beam 242 having 355 nm wavelength is irradiated on the target 203 under an oxygen atmosphere wherein a substrate temperature is 1000° C., a laser output is 200 mW, a repetition frequency is 10 Hz, and a degree of vacuum is 1×$10^{-5}$ torr. The resulting β-$Ga_2O_3$ thin film is white. This means that white cluster-like substances adhere on the flat substrate 206, and hence it is found that a β-$Ga_2O_3$ film is scarcely grown.

According to the comparative example, it is found that a presence of oxygen radicals is effective for growing a β-$Ga_2O_3$ thin-film single crystal on the substrate 206 made of β-$Ga_2O_3$ in addition to the target made of Ga.

Although the PLD method has been mentioned as a manner for growing a β-$Ga_2O_3$ single crystal thin film on a substrate made of a β-$Ga_2O_3$ single crystal, the invention is not limited to the PLD method, but a physical vapor-phase growth method such as MBE (Molecular Beam Epitaxy) method, and MOCVD (Metal Organic Vapor Deposition) method; and a chemical vapor-phase growth method such as thermal CVD (Chemical Vapor Deposition), and plasma CVD are applicable.

Furthermore, although a target having metallic sheet properties has been described, the target is not restricted to that made of a metal, but solid materials other than metals, or liquid materials may also be used. In addition, the target is not limited to that made of Ga, but metals composed of an alloy containing Ga, Zn or an alloy containing Zn are also applicable. According to such modifications, a degree of freedom as to selection of films to be formed increases.

Moreover, beams other than laser beam may be used for excitation beam, so far as it can release metallic atoms and the like when it is irradiated on a metallic target, for example, electron beams, ion beams and the like are applicable.

Besides, a wavelength of a laser is not limited to 266 nm, but other wavelengths, for example, 355 nm, 193 nm and the like are also applicable. Alternatively, a laser output may be changed to 10 mW to 400 mW.

A substrate temperature may be varied from 300 to 1500° C. Because such temperature range is a tolerance for flattening a film to be grown and making dense the film, in other words, a temperature range for improving crystallization.

A degree of vacuum in the chamber 202 may be 1 to 1×$10^{-10}$ torr. Even in the range of a degree of vacuum specified, a β-$Ga_2O_3$ thin-film single crystal can be grown.

Eleventh Embodiment

A $Ga_2O_3$ light-emitting device according to the eleventh embodiment of the invention is obtained by such a manner that a substrate exhibiting n-type conductivity, a substrate exhibiting p-type conductivity, a substrate of an insulation type, a thin film exhibiting p-type conductivity, a thin film exhibiting n-type conductivity, and the like are formed, respectively, and these materials are combined with each other. In the following, a method for manufacturing these components of the light-emitting device and the like matters will be described.

(1) Method for Manufacturing a Substrate Exhibiting n-Type Conductivity

It is required for exhibiting n-type conductivity in a substrate that Ga in the substrate is replaced by an n-type dopant, oxygen in the substrate is replaced by an n-type dopant, or there is an oxygen defect in β-$Ga_2O_3$ single crystal. An example of a gallium substitutional n-type dopant wherein Ga is replaced by an n-type dopant includes Ti, Zr, Hf, V, Nb, Ta, Mo, W, Ru, Rh, Ir, C, Sn, Si, Ge, Pb, Mn, As, Sb, and Bi. An example of an oxygen substitutional n-type dopant wherein oxygen is replaced by an n-type dopant includes F, Cl, Br, and I.

The substrate having n-type conductivity is manufactured as follows. First, a β-$Ga_2O_3$ single crystal is formed in accordance with FZ (Floating Zone) method. Namely, a β-$Ga_2O_3$ seed crystal is prepared separately from a β-$Ga_2O_3$ polycrystalline raw material, the β-$Ga_2O_3$ seed crystal is allowed to be in contact with the β-$Ga_2O_3$ polycrystalline raw material in a silica tube, and a region of both the materials in a contact state is heated, whereby both the β-$Ga_2O_3$ seed crystal and the β-$Ga_2O_3$ polycrystalline raw material are molten in the contact region. When the molten β-$Ga_2O_3$ polycrystalline raw material is crystallized together with the β-$Ga_2O_3$ seed crystal, a β-$Ga_2O_3$ single crystal is produced on the β-$Ga_2O_3$ seed crystal. Thereafter, when the β-$Ga_2O_3$ single crystal is worked through cutting or the like procedures, a substrate exhibiting n-type conductivity is manufactured. When a crystal is grown in the b-axis <010> direction, its cleavage in the (100) plane becomes strong, so that a substrate is fabricated by cutting out the crystal in directions parallel to and perpendicular to the (100) plane, respectively. On one hand, when a crystal is grown in the a-axis <100> direction and the c-axis <001> direction, cleavages in the (100) plane and the (001) plane become weakened, whereby workability in all the planes becomes good, so that there is no limitation as to a plane to be cut out unlike the above-described case. Accordingly, a crystal may be cut out in the (001) plane, the (010) plane, and the (101) plane.

The reason for exhibiting n-type conductivity in the resulting substrate manufactured in accordance with the above-described method is due to oxygen defect in the β-$Ga_2O_3$ single crystal.

(2) Control for Electrical Conductivity of a Substrate Exhibiting n-Type Conductivity An example for a method of controlling a conductivity of a substrate made of a β-$Ga_2O_3$ and exhibiting n-type conductivity includes a manner for controlling an oxygen defect concentration by changing an oxygen partial pressure in its atmosphere, or changing an oxygen flow rate during growth; and a manner for controlling an n-type dopant concentration in accordance with FZ method. The higher oxygen defect concentration results in the higher conductivity. A relationship between an oxygen flow rate and a logarithm of conductivity during a growth of a β-$Ga_2O_3$ single crystal is in that of substantially inverse proportion.

In case of a β-$Ga_2O_3$ single crystal, when an oxygen concentration is changed by varying an oxygen flow rate in a rage of from 0 to 0.2 $m^3$/hour in 1 to 2 atmospheric pressure, a carrier concentration can be controlled between $10^{16}$ to $10^{19}$/$cm^3$.

(3) Method for Manufacturing an Insulation Type Substrate

An insulation type substrate is manufactured as follows. First, a β-$Ga_2O_3$ single crystal exhibiting n-type conductivity is grown by means of control of an oxygen defect concentration as in the case of the method for manufacturing a substrate exhibiting n-type conductivity. Then, the resulting single crystal is annealed in a predetermined temperature (for example, 900° C.) atmosphere for a predetermined period (for example, 6 days) in open air to reduce oxygen defect, whereby an insulation type substrate made of a β-$Ga_2O_3$ single crystal is obtained.

(4) Method for Manufacturing a Substrate Exhibiting p-Type Conductivity

It is required for exhibiting p-type conductivity in a substrate formed from a β-$Ga_2O_3$ single crystal that Ga in the substrate is replaced by a p-type dopant, or oxygen in the substrate is replaced by a p-type dopant. An example of a gallium substitutional p-type dopant wherein Ga is replaced by a p-type dopant includes H, Li, Na, K, Rb, Cs, Fr, Be, Mg, Ca, Sr, Ba, Ra, Mn, Fe, Co, Ni, Pd, Cu, Ag, Au, Zn, Cd, Hg, Tl, Pb and the like. An example of an oxygen substitutional p-type dopant wherein oxygen is replaced by a p-type dopant includes N, P and the like.

A substrate exhibiting p-type conductivity is manufactured as follows. First, a β-$Ga_2O_3$ crystal is formed in accordance with FZ method. As a raw material, for example, a β-$Ga_2O_3$ containing, for example, MgO (p-type dopant source) is homogeneously blended, a rubber tube is charged with the resulting mixture, and subjected to cold compression in 500 MPa to be molded into a rod-like product. The rod-like product is sintered at 1500° C. for 10 hours in atmospheric air to obtain a β-$Ga_2O_3$ polycrystalline raw material containing Mg. A β-$Ga_2O_3$ seed crystal is prepared. The β-$Ga_2O_3$ seed crystal is allowed to be in contact with the β-$Ga_2O_3$ polycrystalline raw material in a silica tube under a growth atmosphere of a full pressure of 1 to 2 atmospheric pressure while flowing a mixed $N_2$ and $O_2$ gas at 500 ml/min, the contact region of them is heated, whereby both the β-$Ga_2O_3$ seed crystal and the β-$Ga_2O_3$ polycrystalline raw material are molten in the contact region. Thus molten β-$Ga_2O_3$ polycrystalline raw material and β-$Ga_2O_3$ seed crystal are rotated oppositely together at a rotating speed of 20 rpm and grown at a growth rate of 5 mm/hour, whereby a transparent and insulative β-$Ga_2O_3$ single crystal containing Mg is produced on the β-$Ga_2O_3$ seed crystal. A substrate is fabricated from the resulting β-$Ga_2O_3$ single crystal, and when the substrate is annealed at a predetermined temperature (e.g. 950° C.) for a predetermined period in an oxygen atmosphere, oxygen defect decreases to obtain the resulting substrate exhibiting p-type conductivity.

(5) Control of Electrical Conductivity in a Substrate Exhibiting p-Type Conductivity An example of a manner for controlling an electrical conductivity in a substrate made of β-$Ga_2O_3$ and exhibiting n-type conductivity includes a method for controlling a p-type dopant concentration in accordance with FZ method.

(6) Method for Manufacturing a Thin Film Exhibiting n-Type Conductivity

A thin film exhibiting n-type conductivity may be formed by a physical vapor phase growth method such as PLD method, MBE method, MOCVD method, and sputtering method; or a chemical vapor phase growth method such as thermal CVD, and plasma CVD.

A film formation according to PLD method will be described. It is required for exhibiting n-type conductivity in a thin film that Ga in the thin film is replaced by an n-type dopant, oxygen in the thin film is replaced by an n-type dopant, or it is based on a presence of an oxygen defect. An example of a gallium substitutional n-type dopant wherein Ga is replaced by an n-type dopant includes Ti, Zr, Hf, V, Nb, Ta, Mo, W, Ru, Rh, Ir, C, Sn, Si, Ge, Pb, Mn, As, Sb, Bi and the like. An example of an oxygen substitutional n-type dopant wherein oxygen is replaced by an n-type dopant includes F, Cl, Br, I and the like.

In PLD method, there are the following-methods as a manner for doping a gallium substitutional n-type dopant or an oxygen substitutional n-type dopant. Namely, they are methods wherein a target made of an alloy consisting of Ga and an n-type dopant, a target made of a sintered material of β-$Ga_2O_3$ and an oxide of an n-type dopant, a target made of a solid solution single crystal of β-$Ga_2O_3$ and an oxide of an n-type dopant, or a target made of a Ga metal, and a target made of an n-type dopant are used.

Furthermore, in PLD method, a thin film exhibiting n-type conductivity due to oxygen defect may be fabricated by employing β-$Ga_2O_3$ crystals (single crystal, polycrystal) as a target, and forming a film in an oxygen atmosphere.

(7) Control for Electrical Conductivity of a Thin Film Exhibiting n-Type Conductivity An example of a manner for controlling an electrical conductivity of a thin film made of β-$Ga_2O_3$ and exhibiting n-type conductivity includes a method for controlling an n-type dopant compounding ratio in a target, a method for changing an irradiation condition of laser or a film formation condition of a substrate to control an oxygen defect concentration, and the like methods.

An example of a method for controlling an n-type concentration according to PLD technique includes a manner for changing a component ratio of Ga and a dopant in a method wherein a target made of an alloy consisting of Ga and an n-type dopant, a target made of a sintered material of β-$Ga_2O_3$ and an oxide of an n-type dopant, or a target made of a solid solution single crystal of β-$Ga_2O_3$ and an oxide of an n-type dopant is used; and a manner for changing an irradiation method of a laser to a target in a method wherein a target made of a Ga metal, or a target made of an n-type dopant is used. More specifically, there are a method wherein a wavelength (e.g. 157 nm, 193 nm, 248 nm, 266 nm, 355 nm etc.) of a laser is changed, and a method wherein a power per one pulse (for example, 10 to 500 mW), or a repetition frequency (for example, 1 to 200 Hz) is changed.

As a manner for controlling an oxygen defect concentration in accordance with PLD method, there are a method for changing an irradiation condition of a laser to a target, and a method for changing a film formation condition of a substrate. An example of the manner for controlling an oxygen defect concentration in accordance with PLD method includes a method for changing a laser wavelength (for example, 157 nm, 193 nm, 248 nm, 266 nm, 355 nm etc.), and a method for changing a power per one pulse (for example, 10 to 500 mW), or a repetition frequency (for example, 1 to 200 Hz). On one hand, an example of the method for changing a film formation condition of a substrate includes a manner for changing a substrate temperature (e.g. 300 to 1500° C.), a manner for changing a distance between a target and a substrate (e.g. 20 to 50 mm), a manner for changing a degree of vacuum in film formation (e.g. $10^{-3}$ to $10^{-7}$ torr), and a manner for changing an output of a plasma gun.

(8) Method for Manufacturing a Thin Film Exhibiting p-Type Conductivity

A thin film exhibiting p-type conductivity may be formed by a physical vapor phase growth method such as PLD method, MBE method, MOCVD method, and sputtering method; or a chemical vapor phase growth method such as thermal CVD, and plasma CVD.

A film formation according to PLD method will be described. It is required for exhibiting p-type conductivity in a thin film that Ga in the thin film is replaced by a p-type dopant, oxygen in the thin film is replaced by a p-type dopant, or it is based on a Ga defect. An example of a gallium substitutional p-type dopant wherein Ga is replaced by a p-type dopant includes H, Li, Na, K, Rb, Cs, Fr, Be, Mg, Ca, Sr, Ba, Ra, Mn, Fe, Co, Ni, Pd, Cu, Ag, Au, Zn, Cd, Hg, Tl, Pb and the like. An example of an oxygen substitutional p-type dopant wherein oxygen is replaced by a p-type dopant includes P and the like.

In PLD method, a manner for doping a gallium substitutional p-type dopant or a manner for doping an oxygen substitutional p-type dopant is a method for doping a p-type dopant in a thin film growth process. Namely, as a manner for doping a p-type dopant, there are the following methods wherein a target made of an alloy consisting of Ga and an p-type dopant, a target made of a sintered material of $\beta$-$Ga_2O_3$ and an oxide of a p-type dopant, a target made of a solid solution single crystal of $\beta$-$Ga_2O_3$ and an oxide of a p-type dopant, or a target made of a Ga metal, and a target made of a p-type dopant are used.

Furthermore, a thin film exhibiting p-type conductivity due to Ga defect may be fabricated by employing a Ga metal, a $\beta$-$Ga_2O_3$ sintered material, or $\beta$-$Ga_2O_3$ crystals (single crystal, polycrystal) as a target, and growing a $\beta$-$Ga_2O_3$ crystal in an atmosphere of $N_2O$ converted to radicals by means of a plasma gun.

(9) Control for Electrical Conductivity of a Thin Film Exhibiting p-Type Conductivity An example of a manner for controlling an electrical conductivity of a thin film made of $\beta$-$Ga_2O_3$ and exhibiting p-type conductivity includes a method for controlling an p-type dopant compounding ratio in a target, a method for changing an irradiation condition of laser or a film formation condition of a substrate to control a Ga defect concentration, and the like methods.

An example of a method for controlling a p-type concentration according to PLD technique includes a method for using a target made of an alloy composed of Ga and a p-type dopant, or a target made of a sintered material composed of $\beta$-$Ga_2O_3$ and an oxide of a p-type dopant, a method for using a target made of a solid solution single crystal composed of $\beta$-$Ga_2O_3$ and an oxide of a p-type dopant, and a method for using a target made of a Ga metal, or a target made of a p-type dopant. In the method for using a target made of a solid solution single crystal of $\beta$-$Ga_2O_3$ and an oxide of a p-type dopant, there is a manner for changing a component ratio of Ga and a p-type dopant. In a method for using a target made of a Ga metal, or a target made of a p-type dopant, there is a manner for changing an irradiation method of a laser to a target. For instance, there are a method wherein a wavelength (e.g. 157 nm, 193 nm, 248 nm, 266 nm, 355 nm etc.) of a laser is changed, and a method wherein a power per one pulse (for example, 10 to 500 mW), or a repetition frequency (for example, 1 to 200 Hz) is changed.

An example of the manner for controlling a Ga defect concentration in accordance with PLD method includes a method for changing a laser wavelength (for example, 157 nm, 193 nm, 248 nm, 266 nm, 355 nm etc.), and a method for changing a power per one pulse (for example, 10 to 500 mW), or a repetition frequency (for example, 1 to 200 Hz). On one hand, an example of the method for changing a film formation condition of a substrate includes a manner for changing a substrate temperature (e.g. 300 to 1500° C.), a manner for changing a distance between a target and a substrate (e.g. 20 to 50 mm), a manner for changing a degree of vacuum in film formation (e.g. $10^{-3}$ to $10^{-7}$ torr), and a manner for changing an output of a plasma gun.

(10) Electrode

An electrode is formed by vapor deposition, sputtering or the like manner on a thin film or a substrate exhibiting p-type conductivity, or a thin film or a substrate exhibiting n-type conductivity. The electrode is formed by a material from which an ohmic contact is obtained. For instance, a single metal of, an alloy obtained from at least two (e.g. Au—Ge alloy) of, or a two-layered structure (e.g. Al/Ti, Au/Ni, Au/Co) formed from Au, Al, Ti, Sn, Ge, In, Ni, Co, Pt, W, Mo, Cr, Cu, Pb and the like, or ITO is formed on a thin film or substrate exhibiting n-type conductivity. A single metal of, an alloy obtained from at least two (e.g. Au—Zn alloy, Au—Be alloy) of, or a two-layered structure (e.g. Ni/Au) formed from Au, Al, Be, Ni, Pt, In, Sn, Cr, Ti, Zn and the like, or ITO is formed on a thin film or substrate exhibiting p-type conductivity.

According to the eleventh embodiment, when a second layer exhibiting p-type conductivity is formed on a first layer exhibiting n-type conductivity, a light-emitting device having a PN junction can be formed, so that emission of a light in ultraviolet region becomes possible due to a bandgap contained in a $\beta$-$Ga_2O_3$ single crystal.

Twelfth Embodiment

Figure 17:
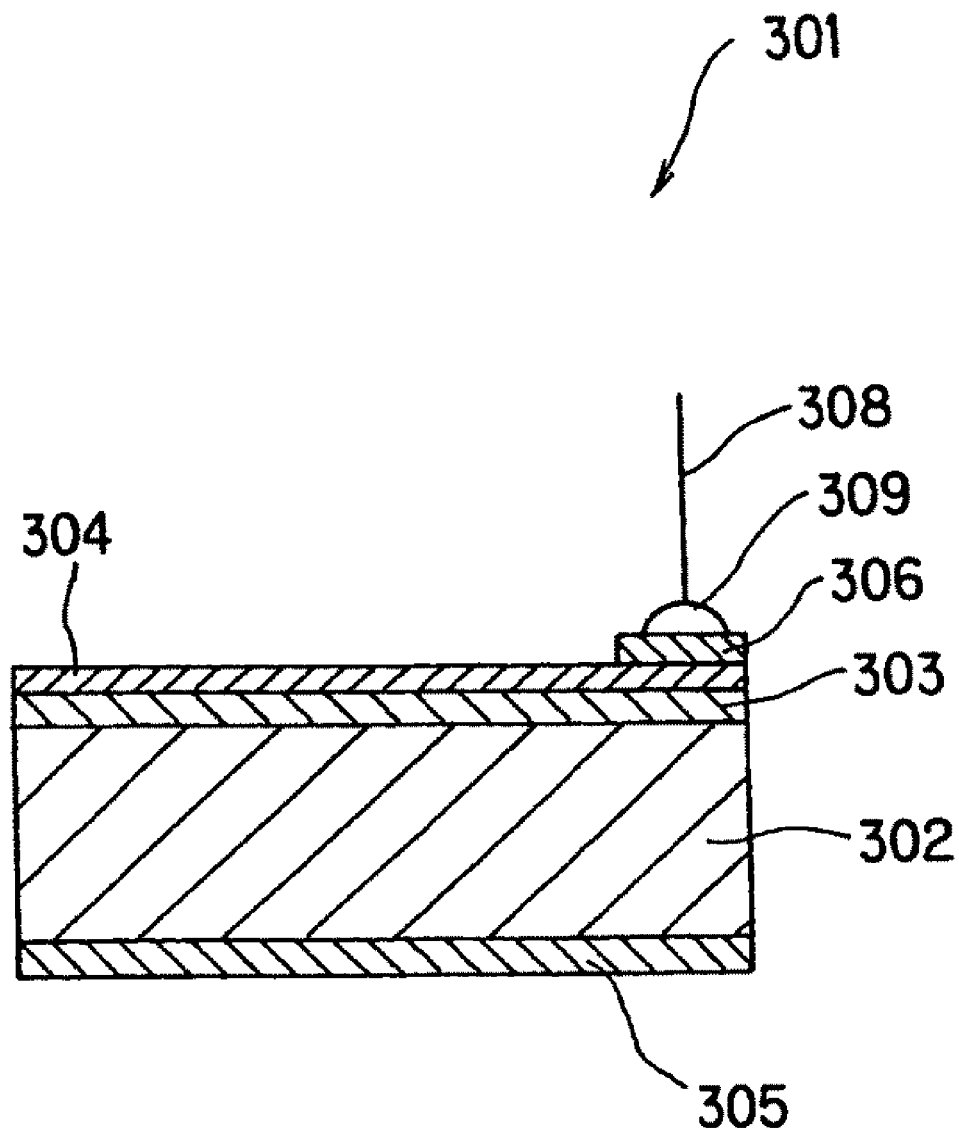
FIG. 17 is a sectional view showing a Ga$_2$O$_3$ light-emitting device according to a twelfth embodiment of the invention.

FIG. 17 shows a section of a $Ga_2O_3$ light-emitting device according to the twelfth embodiment of the present invention wherein the light-emitting device 301 is provided with an n-type substrate 302 made of a $\beta$-$Ga_2O_3$ single crystal and exhibiting n-type conductivity, a p-type layer 303 made of the $\beta$-$Ga_2O_3$ single crystal, exhibiting p-type conductivity, and formed on the top of the n-type substrate 302, a transparent electrode 304 formed on the top of the p-type layer 303, a bonding electrode 306 formed on a part of the transparent electrode 304, and an n-electrode 305 formed on the whole surface of the bottom of the n-type substrate 302. The bonding electrode 306 is formed from, for example, Pt, while the n-electrode 305 is formed from, for example, Au. A lead 308 is connected to the bonding electrode 306 through the bonding 309. The transparent electrode 304 is formed from, for example, Au/Ni.

Figure 18:
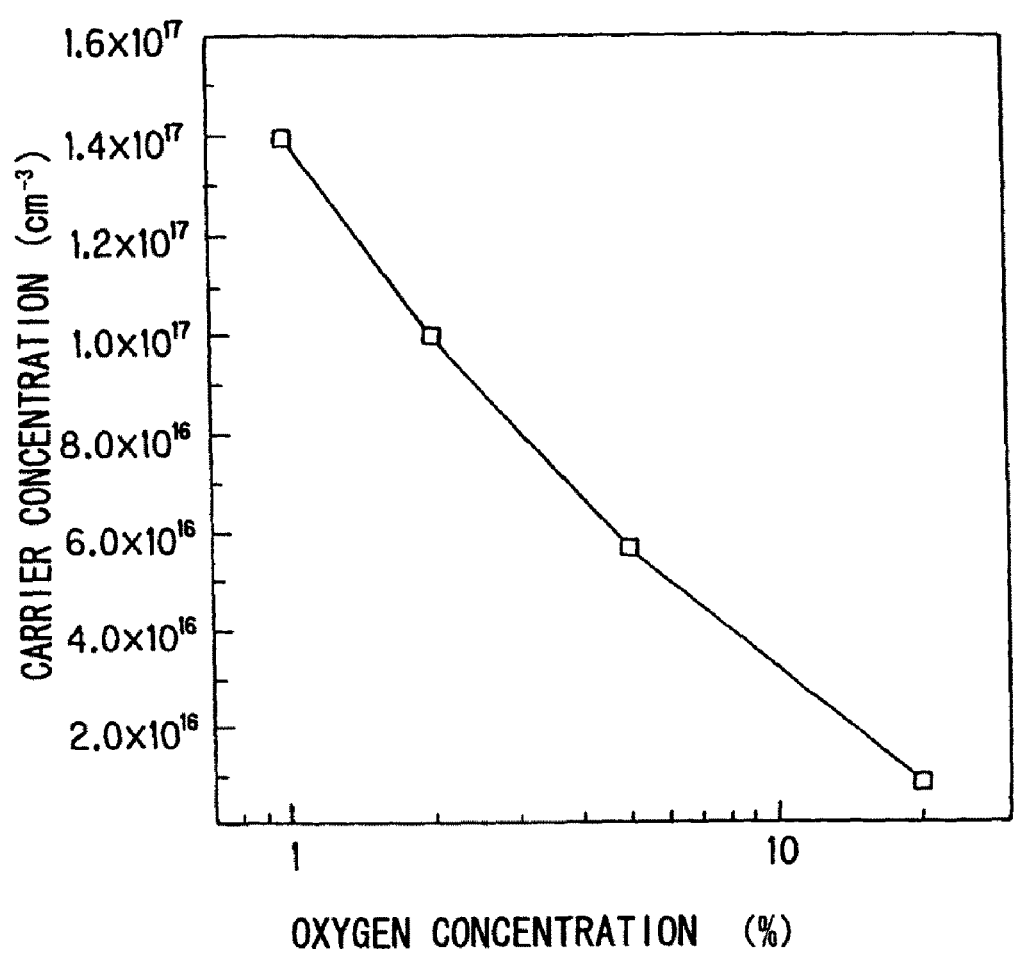
FIG. 18 is a diagram showing a relationship between an oxygen concentration and a carrier concentration of the β-Ga$_2$O$_3$ single crystal according to the twelfth embodiment of the invention.

In the following, a method for manufacturing the light-emitting device 301 will be described by referring to the accompanying drawings wherein FIG. 18 shows a relationship between an oxygen concentration and a carrier concentration. First, a β-Ga$_2$O$_3$ single crystal is formed in accordance with FZ method as mentioned above. As shown in FIG. 18, when an oxygen concentration is changed between 1 and 20% in case of growing the β-Ga$_2$O$_3$ single crystal, it is possible to control a carrier concentration of the β-Ga$_2$O$_3$ single crystal between $1.4 \times 10^{17}$ to $1 \times 10^{16}$/cm$^3$. When a β-Ga$_2$O$_3$ single crystal manufactured through single crystallization at 1 to 20 mm/hour is worked by cutting out the resulting single crystal, the n-type substrate 302 exhibiting n-type conductivity is fabricated. A carrier concentration of the n-type substrate 302 is $1 \times 10^{17}$/cm$^3$, while a carrier concentration of the p-type layer 303 is $10^{16}$/cm$^3$.

Figure 19:
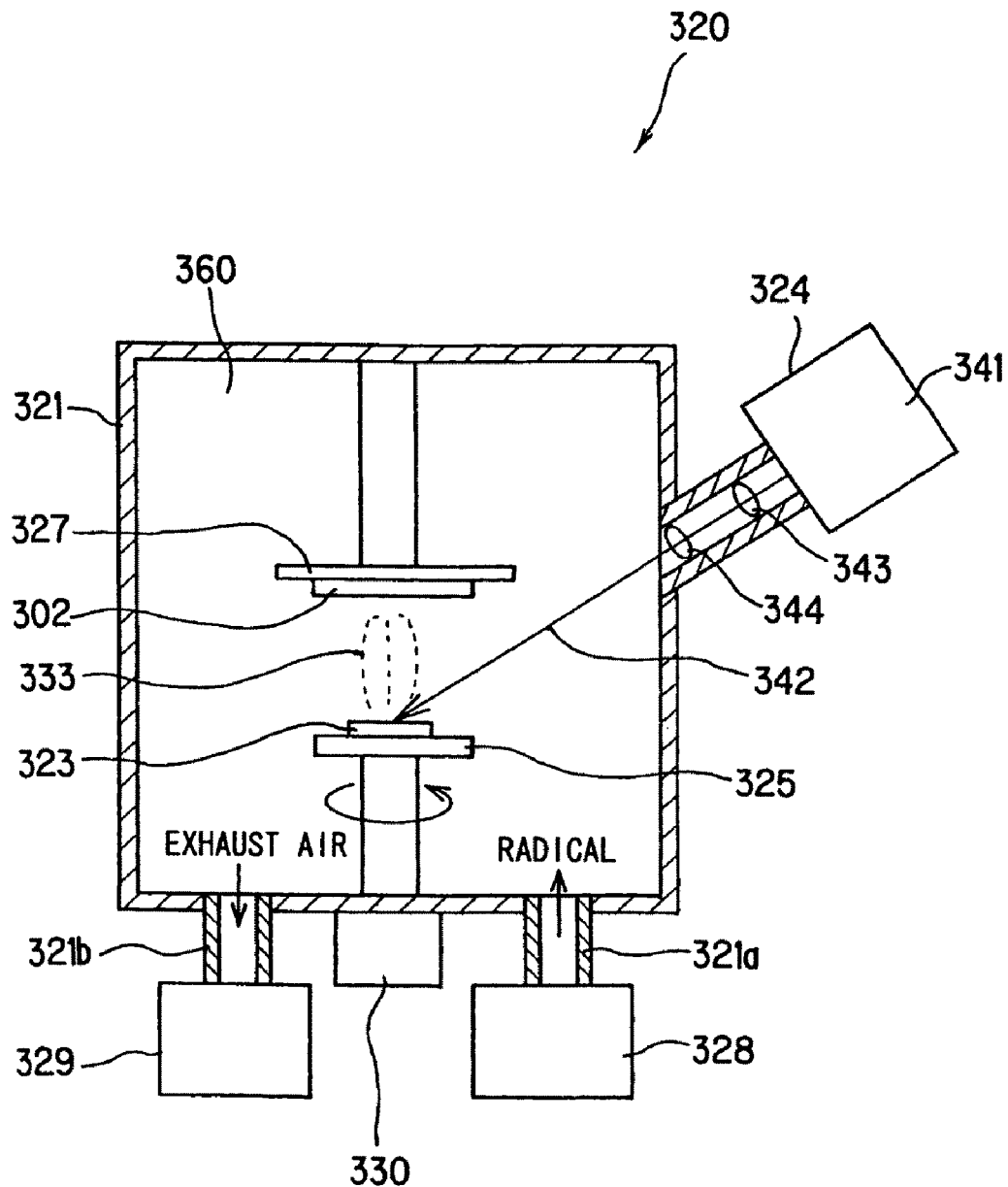
FIG. 19 is a view showing a schematic constitution of film formation equipment for manufacturing the Ga$_2$O$_3$ light-emitting device according to the twelfth embodiment of the invention.

FIG. 19 shows a schematic constitution of film formation equipment for manufacturing a light-emitting device according to the twelfth embodiment of the invention. The film formation equipment 320 performs the film formation in accordance with PLD method and which is provided with a chamber 321 containing a space 360 which can be evacuated, a target table 325 placed in the chamber 321, a target 323 being maintained on the target table, a rotation mechanism 330 placed outside the chamber 321 and for rotating the target table 325, a substrate holding section 327 placed inside the chamber 321 and for holding an n-type substrate 302, a heater which can heat the n-type substrate 302 up to 1500° C. being housed in the substrate holding section, a radical injection section 328 for injecting radicals into the chamber 321 through a pipe 321a, an exhaust section 329 having a vacuum pump (not shown) for exhausting the space 360 through a pipe 312b to evacuate the space 360, and a laser section 324 provided outside the chamber 321 and for irradiating a laser beam 342 as an excitation beam to the target 323.

The target 323 is made from, for example, an alloy containing a high-purity Ga and Mg, a β-Ga$_2$O$_3$ crystal (single crystal or polycrystal) doped with Mg, a β-Ga$_2$O$_3$ sintered material doped with Mg or the like material. The target may be made either from a solid material other than alloys, or a liquid material.

The laser section 324 is provided with a laser oscillation section 341 for irradiating the laser beam 342 in a pulsed manner and employing Nd:YAG laser, KrF excimer laser, ArF excimer laser and the like as a laser source, and lenses 343 and 344 for condensing the laser beam 342 output from the laser oscillation section 341 on the target 323.

The n-type substrate 302 is opposed to the target 323 in such that chemical species 333 such as metal atoms dissociated from the target 323 at the time when the laser beam 342 is irradiated on the target 323 can form a film.

The radical injection section 328 is arranged to inject one, two or more of a gas (gases) selected from oxygen gas, oxygen gas containing ozone, pure ozone gas, N$_2$O gas, NO$_2$ gas, oxygen gas containing oxygen radicals, oxygen radicals and the like, in other words, a gas to be combined with metallic atoms released from the target 323 at the time of a film formation into the space 360.

Next, a method for forming the p-type layer 303 made of β-Ga$_2$O$_3$ on the surface of the n-type substrate 302 will be described. The above-mentioned film formation equipment 320 is used for growing the p-type layer 303 on the n-type substrate 302. Namely, as the target 323, for example, a target 323 made of an alloy consisting of Ga and Mg is fixed to the target table 325. The n-type substrate 302 is held by the substrate holding section 327. Air in the space 360 is exhausted by means of the vacuum pump contained in the exhaust section 329 to be a degree of vacuum in the space 360 of, for example, around $1 \times 10^{-9}$ torr, then, for example, oxygen gas is injected into the space 360 to be a degree of vacuum of around $1 \times 10^{-7}$ torr, and the n-type substrate 302 is heated at a temperature of 300° C. to 1500° C. by energizing a heater provided in the substrate holding section 327. Thereafter, oxygen radicals are injected by the radical injection section 328 into the space 360 to be a degree of vacuum of $1 \times 10^{-6}$ to $1 \times 10^{-4}$ torr. When the laser beam 342 of 266 nm wavelength is irradiated from the laser section 324 with a laser output of 100 mW at a repetition frequency of 10 Hz on the target 323 rotated by the rotation mechanism 330, Ga atoms and Mg atoms constituting the target 323 are excited, so that chemical species 333 such as metallic atoms, metallic ions, excited metallic atoms, and excited metallic ions released from the target 323 combine with the oxygen radicals in the atmosphere on the substrate 302 due to thermal and photochemical actions, whereby the p-type layer 303 made of a β-Ga$_2$O$_3$ single crystal is formed. The conductivity is due to the fact that Mg functions as an acceptor.

Thereafter, by means of appropriate processes, the transparent electrode 304 is formed on the surface of the p-type layer 303, the bonding electrode 306 is formed on a part of the transparent electrode 304, and the n-electrode 305 is formed on the whole surface of the bottom of the n-type substrate 302. Then, the lead 308 is connected to the bonding electrode 306 through the bonding 309.

According to the twelfth embodiment, the following advantages are obtained.

(a) Since the n-type substrate 302 is joined to the p-type layer 303, a light-emitting device of PN junction can be formed. As a result, it becomes possible to emit a light having such a short wavelength of 260 nm due to a broad bandgap derived from a β-Ga$_2$O$_3$ single crystal.

(b) The n-type substrate 302 and the p-type layer 303 consist of β-Ga$_2$O$_3$ as their major components, respectively, whereby it makes possible to require no buffer layer, so that a p-type layer having high crystallinity can be formed.

(c) Since the n-type substrate 302 is conductive, a vertical type structure from which electrodes may be lead out via the top and the bottom routes is applicable. As a result, a layer constitution and manufacturing processes of the n-type substrate can be simplified.

(d) Since the n-type substrate 302 has high permeability in its emitting region, light-extraction efficiency may be increased, so that ultraviolet ray having such a short wavelength of 260 nm can be extracted also from a side of the substrate.

(e) Since an oxide β-Ga$_2$O$_3$ single crystal is used for the n-type substrate 302 and the p-type layer 303, a light-emitting device which is stably operated even in the atmospheric air of a high temperature can be formed.

Thirteenth Embodiment

Figure 20:
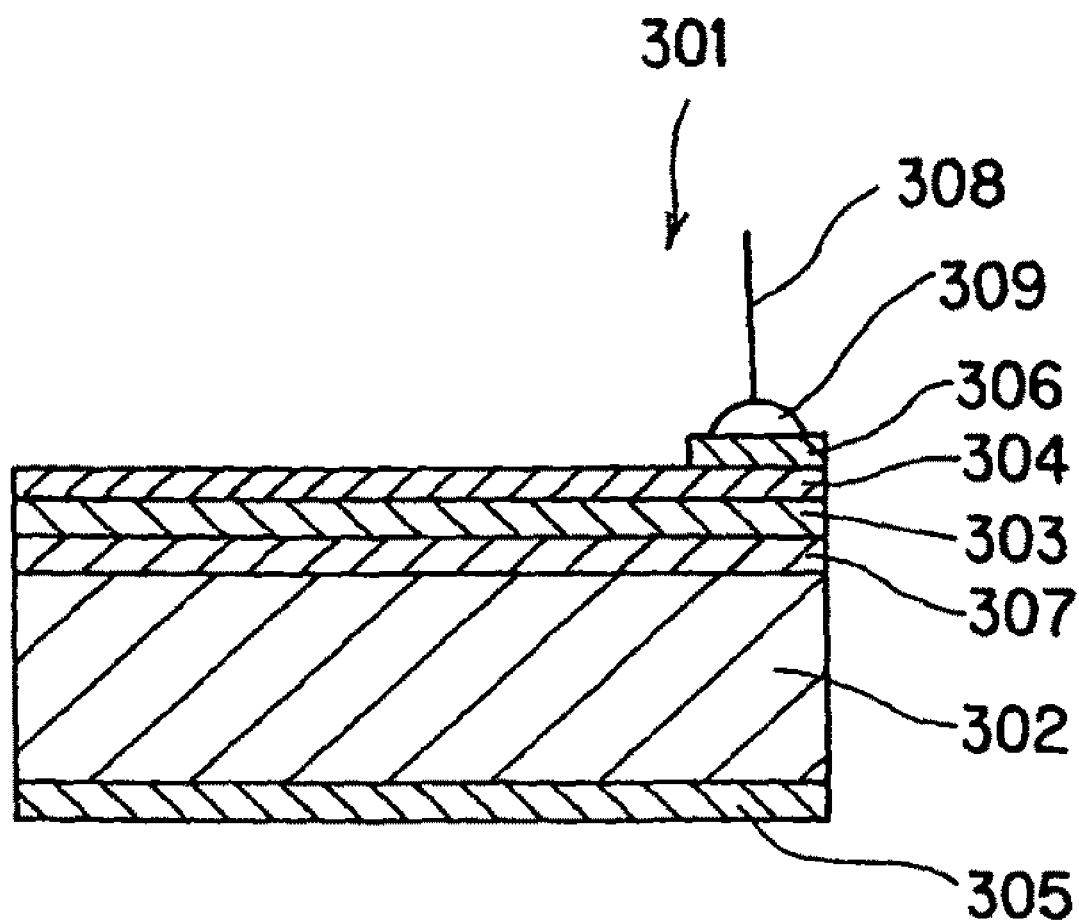
FIG. 20 is a sectional view showing a Ga$_2$O$_3$ light-emitting device according to a thirteenth embodiment of the invention.

FIG. 20 shows a section of a Ga$_2$O$_3$ light-emitting device according to the thirteenth embodiment of the invention. A light-emitting device 301 of the present embodiment differs from the light-emitting device 301 of the twelfth embodiment in that an n-type layer 307 made of a β-Ga$_2$O$_3$ single crystal, having a different carrier concentration from that of an n-type substrate 302, and exhibiting n-type conductivity is formed in between a p-type layer 303 and the n-type substrate 302.

Next, a case where the n-type layer 307 is formed on the surface of the n-type substrate 302 will be described wherein the n-type layer 307 is formed by using the film formation equipment 320 shown in FIG. 19, and a target 323 made of, for example, an alloy containing high-purity Ga and Sn, a Sn doped β-Ga$_2$O$_3$ single crystal, or a Sn doped β-Ga$_2$O$_3$ crystal sintered material is used.

First, for example, a target 323 made of an alloy consisting of Ga and Sn is fixed to a target table 325. An n-type substrate 302 is held by a substrate holding section 327. Air in a space 360 is exhausted by means of a vacuum pump contained in an exhaust section 329 to be a degree of vacuum in the space 360 of, for example, around $1\times10^{-9}$ torr, then, for example, oxygen gas is injected into the space 360 to be a degree of vacuum of around $1\times10^{-7}$ torr, and the n-type substrate 302 is heated at a temperature of 300° C. to 1500° C. by energizing a heater provided in the substrate holding section 327. Thereafter, oxygen radicals are injected by a radical injection section 328 into the space 360 to be a degree of vacuum of $1\times10^{-6}$ to $1\times10^{-4}$ torr. When a laser beam 342 of 266 nm wavelength is irradiated from a laser section 324 with a laser output of 100 mW at a repetition frequency of 10 Hz on the target 323 rotated by a rotation mechanism 330, Ga atoms and Sn atoms constituting the target 323 are excited, so that chemical species 333 such as metallic atoms, metallic ions, excited metallic atoms, and excited metallic ions released from the target 323 combine with the oxygen radicals in the atmosphere on the n-type substrate 302 due to thermal and photochemical actions, whereby the n-type layer 307 is formed. In this case, a carrier concentration of the n-type layer 307 is arranged to be lower than that of the n-type substrate 302 by means of reducing an oxygen radical concentration during a growth of a film. More specifically, a carrier concentration of the n-type substrate 302 is $2\times10^{18}/cm^3$, a carrier concentration of the n-type layer 307 is $10^{17}/cm^3$, and a carrier concentration of the p-type layer 303 is $10^{16}/cm^3$.

Thereafter, by means of appropriate processes, a transparent electrode 304 is formed on the surface of the p-type layer 303, a bonding electrode 306 is formed on a part of the transparent electrode 304, and an n-electrode 305 is formed on the whole surface of the bottom of the n-type substrate 302. Then, a lead 308 is connected to the bonding electrode 306 through a bonding 309.

According to the thirteenth embodiment, the following advantages are obtained.

(a) Since a carrier concentration of the n-type layer 307 is allowed to be lower than that of the n-type substrate 302, crystallinity of the p-type layer 303 becomes better, whereby luminous efficiency is more elevated in comparison with that of the twelfth embodiment.

(b) Since the n-type substrate 307 is joined to the p-type layer 303, a light-emitting device of PN junction can be formed. As a result, it becomes possible to emit a light having such a short wavelength of 260 nm due to a broad bandgap derived from a β-$Ga_2O_3$ single crystal.

(c) The n-type substrate 302 and the n-type layer 307 consist of β-$Ga_2O_3$ as their major components, respectively, whereby it makes possible to require no buffer layer, so that an n-type layer having high crystallinity can be formed.

(d) Since the n-type substrate 302 is conductive, a vertical type structure from which electrodes may be lead out via the top and the bottom routes is applicable. As a result, a layer constitution and manufacturing processes of the n-type substrate can be simplified.

(e) Since the n-type substrate 302 has high permeability in its emitting region, light-extraction efficiency may be increased, so that ultraviolet ray having such a short wavelength of 260 nm can be extracted also from a side of the substrate.

(f) Since an oxide β-$Ga_2O_3$ single crystal is used for the n-type substrate 302, the n-type layer 307, and the p-type layer 303, a light-emitting device which is stably operated even in the atmospheric air of a high temperature can be formed.

Fourteenth Embodiment

Figure 21:
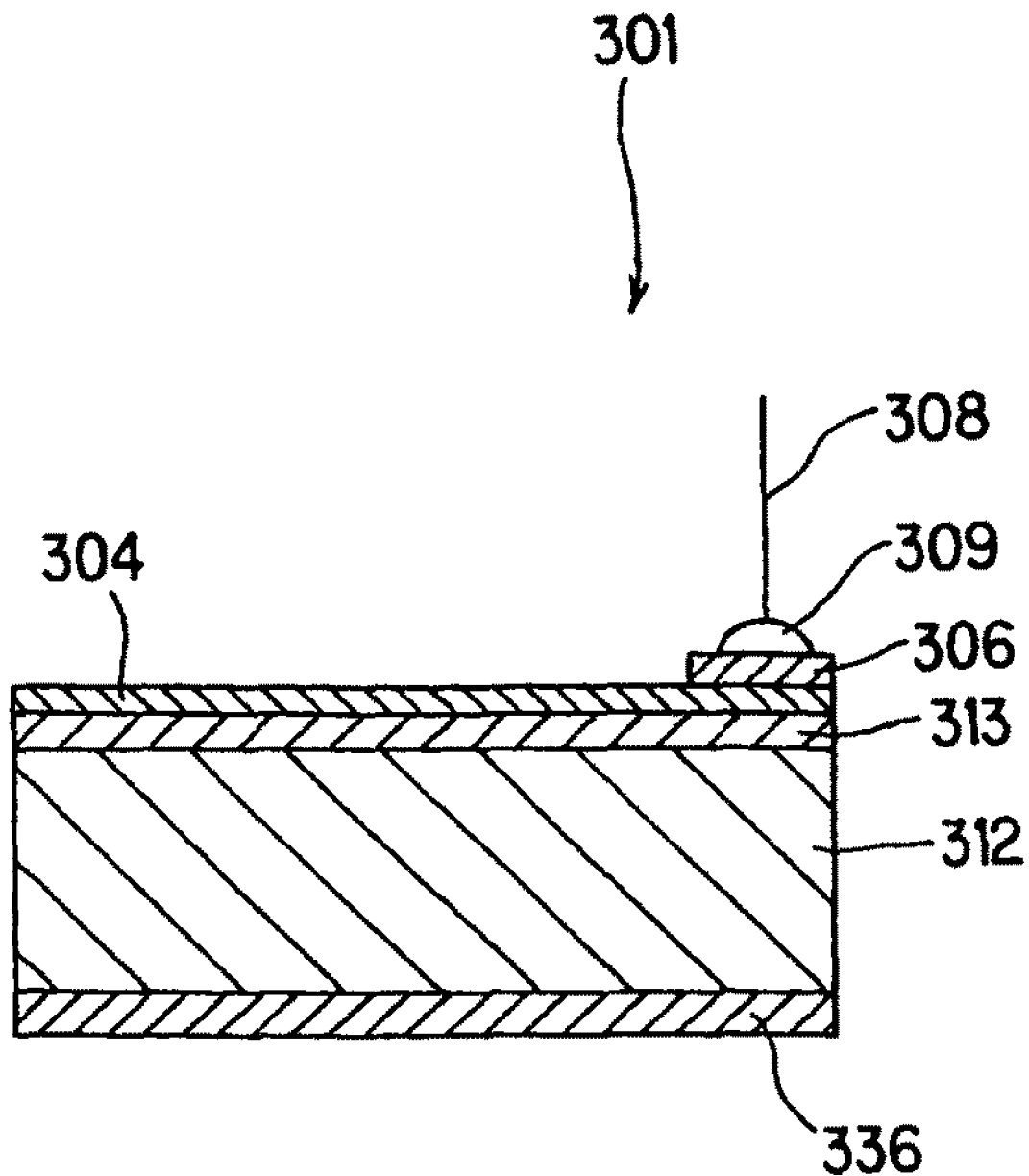
FIG. 21 is a sectional view showing a Ga$_2$O$_3$ light-emitting device according to a fourteenth embodiment of the invention.

FIG. 21 shows a section of a $Ga_2O_3$ light-emitting device according to the fourteenth embodiment of the invention wherein the light-emitting device 301 is provided with an p-type substrate 312 made of a β-$Ga_2O_3$ single crystal and exhibiting p-type conductivity, an n-type layer 313 made of the β-$Ga_2O_3$ single crystal, exhibiting n-type conductivity, and formed on the top of the p-type substrate 312, a transparent electrode 304 formed on the top of the n-type layer 313, a bonding electrode 306 formed on a part of the transparent electrode 304, and a p-electrode 336 formed on the whole surface of the bottom of the p-type substrate 312. A lead 308 is connected to the bonding electrode 306 through a bonding 309. The p-electrode 335 is formed from, for example, Pt, while the bonding electrode 306 is formed from, for example, Au.

In the following, a method for manufacturing the light-emitting device 301 will be described. First, a β-$Ga_2O_3$ crystal is formed in accordance with FZ method. As a raw material, for example, a β-$Ga_2O_3$ containing, for example, MgO as a dopant (p-type dopant source) is homogeneously blended, a rubber tube is charged with the resulting mixture, and subjected to cold compression in 500 MPa to be molded into a rod-like product. The rod-like product is sintered at 1500° C. for 10 hours in atmospheric air to obtain a β-$Ga_2O_3$ polycrystalline raw material. A $Ga_2O_3$ seed crystal is prepared. The β-$Ga_2O_3$ seed crystal is allowed to be in contact with the β-$Ga_2O_3$ polycrystalline raw material in a silica tube under a growth atmosphere of a full pressure of 1 to 2 atmospheric pressure while flowing a mixed $N_2$ and $O_2$ gas at 500 mL/min, the contact region of them is heated, whereby both the β-$Ga_2O_3$ seed crystal and the β-$Ga_2O_3$ polycrystalline raw material are molten in the contact region. Thus molten β-$Ga_2O_3$ polycrystalline raw material and β-$Ga_2O_3$ seed crystal are rotated opposedly together at a rotating speed of 20 rpm and grown at a draw-down rate of 5 mm/hour, whereby a transparent β-$Ga_2O_3$ single crystal is produced on the β-$Ga_2O_3$ seed crystal. A substrate is fabricated by applying working such as cutting-out operation to the resulting β-$Ga_2O_3$ single crystal. Then, when the substrate is annealed at 950° C. in an oxygen atmosphere, a p-type substrate exhibiting p-type conductivity is obtained. Thereafter, the n-type layer 313 is formed as shown in the thirteenth embodiment, and further the bonding electrode 306, the p-electrode 336 and the like are formed.

In the light-emitting device 301 of the fourteenth embodiment, the p-type substrate 312 is joined to the n-type layer formed on the top of the p-type substrate 312. Hence, when a polarity of the bonding electrode 306 is allowed to be minus, while a polarity of the p-electrode 336 is allowed to be plus and a power voltage is applied, positive holes in the p-type substrate 312 and electrons in the n-type layer 313 go to a junction, respectively in the junction of the p-type substrate 312 and the n-type layer 313. Then, these positive holes rejoin with the electrons in the vicinity of the junction, so that a light is emitted at the vicinity of the junction.

According to the fourteenth embodiment, the following advantages are obtained.

(a) Since the p-type substrate 312 is joined to the n-type layer 313, a light-emitting device of PN junction can be formed. As a result, it becomes possible to emit a light having such a short wavelength of 260 nm due to a broad bandgap derived from a β-$Ga_2O_3$ single crystal.

(b) The p-type substrate 312 and the n-type layer 313 consist of β-$Ga_2O_3$ as their major components, respectively, whereby it makes possible to require no buffer layer, so that an n-type layer 313 having high crystallinity can be formed.

(c) Since the p-type substrate 312 is conductive, a vertical type structure from which electrodes may be lead out via the top and the bottom routes is applicable. As a result, a layer constitution and manufacturing processes of the p-type substrate can be simplified.

(d) Since the p-type substrate 312 has high permeability in its emitting region, light-extraction efficiency may be increased, so that ultraviolet ray having such a short wavelength of 260 nm can be extracted also from a side of the substrate.

(e) Since an oxide $\beta$-$Ga_2O_3$ single crystal is used for the p-type substrate 312 and the n-type layer 313, a light-emitting device which is stably operated even in the atmospheric air of a high temperature can be formed.

Fifteenth Embodiment

Figure 22:
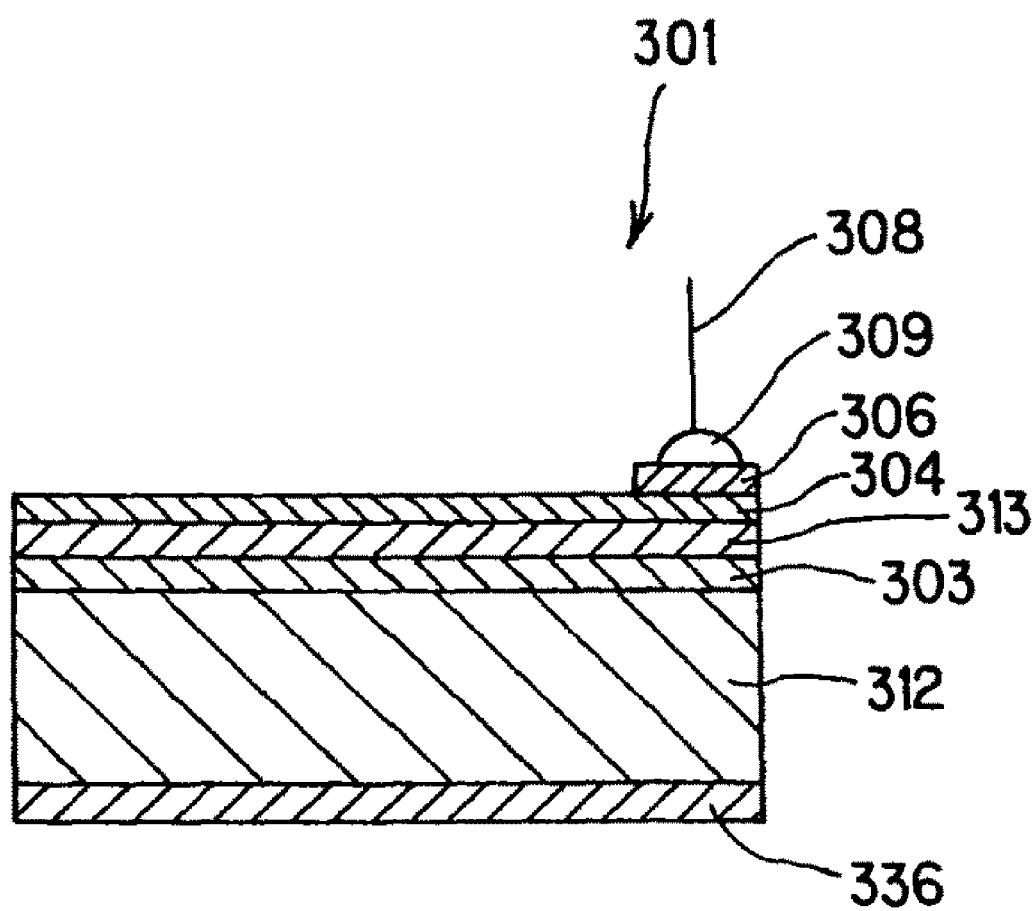
FIG. 22 is a sectional view showing a Ga$_2$O$_3$ light-emitting device according to a fifteenth embodiment of the invention.

FIG. 22 shows a section of a $Ga_2O_3$ light-emitting device according to the fifteenth embodiment of the invention. A light-emitting device 301 of the present embodiment differs from the light-emitting device 301 of the fourteenth embodiment in that a p-type layer 303 made of a $\beta$-$Ga_2O_3$ single crystal, and exhibiting p-type conductivity is formed in between an n-type layer 313 and the p-type substrate 312. The p-type layer 303 functions to control the above-described conductivity, so that it is formed to have a lower carrier concentration than that of the p-type substrate 312.

In the light-emitting device 301, the p-type substrate 312 is formed as in the fourteenth embodiment, the p-type layer 303 is formed on the p-type substrate 312 as in the twelfth embodiment, and the n-type layer 313 is formed on the p-type layer 303 as in the thirteenth embodiment.

According to the fifteenth embodiment, the following advantages are obtained.

(a) Since a carrier concentration of the p-type layer 303 is made to be lower than that of the p-type substrate 312, deterioration in luminous efficiency can be prevented.

(b) Since the n-type substrate 313 is joined to the p-type layer 303, a light-emitting device of PN junction can be formed. As a result, it becomes possible to emit a light having such a short wavelength of 260 nm due to a broad bandgap derived from a $\beta$-$Ga_2O_3$ single crystal.

(c) The p-type substrate 312 and the p-type layer 303 consist of $\beta$-$Ga_2O_3$ as their major components, respectively, whereby it makes possible to require no buffer layer, so that an n-type layer 313 having high crystallinity can be formed.

(d) Since the p-type substrate 312 is conductive, a vertical type structure from which electrodes may be lead out via the top and the bottom routes is applicable. As a result, a layer constitution and manufacturing processes of the p-type substrate can be simplified.

(e) Since the p-type substrate 312 has high permeability in its emitting region, light-extraction efficiency may be increased, so that ultraviolet ray having such a short wavelength of 260 nm can be extracted also from a side of the substrate.

(f) Since an oxide $\beta$-$Ga_2O_3$ single crystal is used for the p-type substrate 312 and the n-type layer 313, a light-emitting device which is stably operated even in the atmospheric air of a high temperature can be formed.

Sixteenth Embodiment

Figure 23:
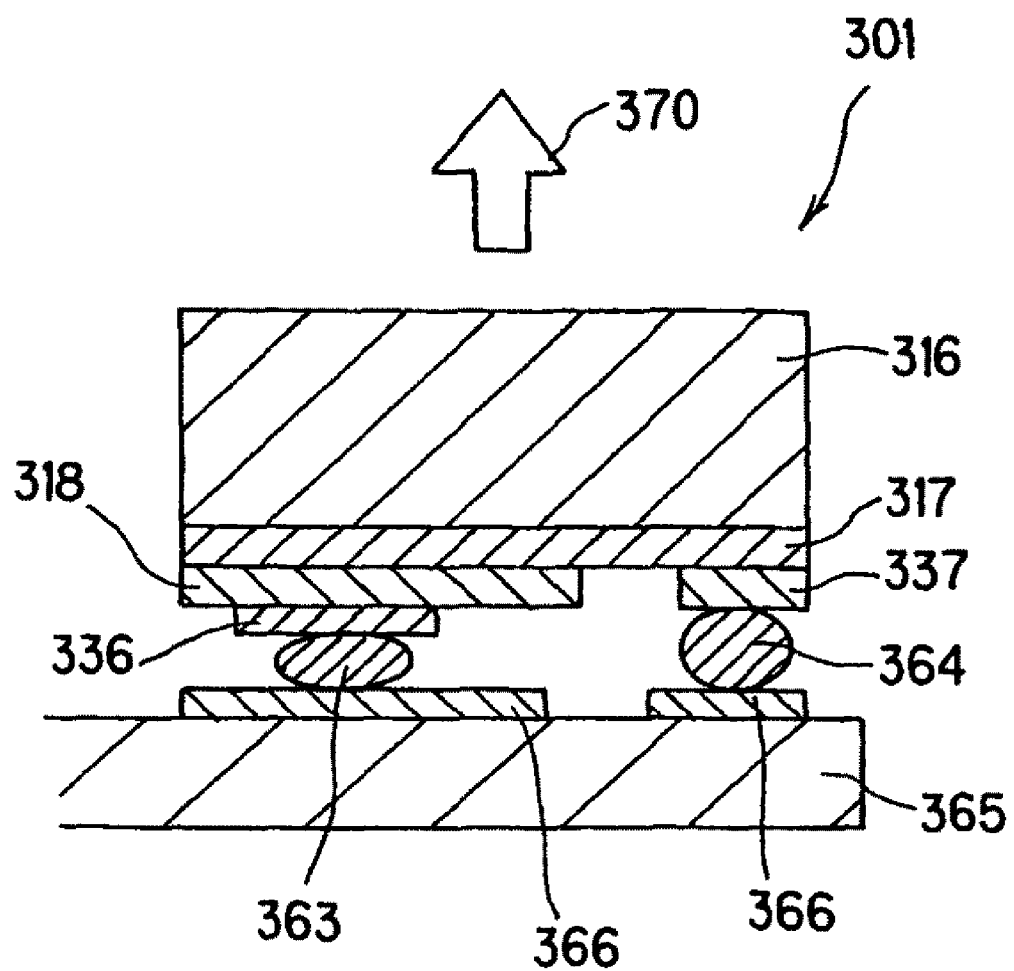
FIG. 23 is a sectional view showing a Ga$_2$O$_3$ light-emitting device according to a sixteenth embodiment of the invention.

FIG. 23 shows a section of a $Ga_2O_3$ light-emitting device according to the sixteenth embodiment of the invention wherein the light-emitting device 301 is provided with an insulation type substrate 316 made of a $\beta$-$Ga_2O_3$ single crystal, an n-type layer 317 made of the $\beta$-$Ga_2O_3$ single crystal, exhibiting n-type conductivity, and formed on the bottom of the insulation type substrate 316, p-type layer 318 made of the $\beta$-$Ga_2O_3$ single crystal, exhibiting p-type conductivity, and formed on the bottom of a part of the n-type layer 317, a p-electrode 336 formed on the n-type layer 317, and an n-electrode 337 formed on the n-type layer 317. The p-electrode 336 is formed from, for example, Pt, while the n-electrode 337 is formed from, for example, Au and the like. The p-electrode and the n-electrode 337 are connected to a print pattern 366 on a printed-circuit board 365 through solder balls 363 and 364, respectively.

The light-emitting device 301 emits a light at a pn junction at which the n-type layer 317 is joined to the p-type layer 318, and the light emitted transmits through the insulation type substrate 316 to be output upwards as an output light 370.

Next, a method for manufacturing the light-emitting device 301 will be described. The insulation type substrate 316 is obtained as follows. A substrate made of $\beta$-$Ga_2O_3$ and exhibiting n-type conductivity which is obtained as in the twelfth embodiment in accordance with FZ method is annealed at a temperature of 950° C. in atmospheric air, whereby oxygen defect can be reduced to obtain the insulation type substrate 316. The n-type layer 317 is formed on the insulation type substrate 316 as in the fourteenth embodiment. A part of the n-type layer 317 is masked to form the p-type layer 318 as in the twelfth embodiment. After removing the masking, the p-electrode 336 is formed on the p-type layer 318 and the n-electrode 337 is formed on a part of the n-type layer 317, respectively.

According to the sixteenth embodiment, the following advantages are obtained.

(a) Since the n-type layer 317 is joined to the p-type layer 318, a light-emitting device of PN junction can be formed. As a result, it becomes possible to emit a light having such a short wavelength of 260 nm due to a broad bandgap derived from a $\beta$-$Ga_2O_3$ single crystal.

(b) Since a flip-chip bonding becomes possible as to a manner for connecting a printed-circuit board or a lead frame, exothermic heat from emitting region can be dissipated efficiently to the printed-circuit board or the lead frame.

(c) The insulation type substrate 316 and the n-type layer 317 consist of $\beta$-$Ga_2O_3$ as their major components, respectively, whereby it makes possible to require no buffer layer, so that an n-type layer 317 having high crystallinity can be formed.

(d) Since the insulation type substrate 316 has high permeability in its emitting region, light-extraction efficiency may be increased, so that ultraviolet ray having such a short wavelength of 260 nm can be extracted also from a side of the substrate.

(e) Since an oxide $\beta$-$Ga_2O_3$ single crystal is used for the n-type substrate 316 and the n-type layer 318, a light-emitting device which is stably operated even in the atmospheric air of a high temperature can be formed.

Seventeenth Embodiment

Figure 24:
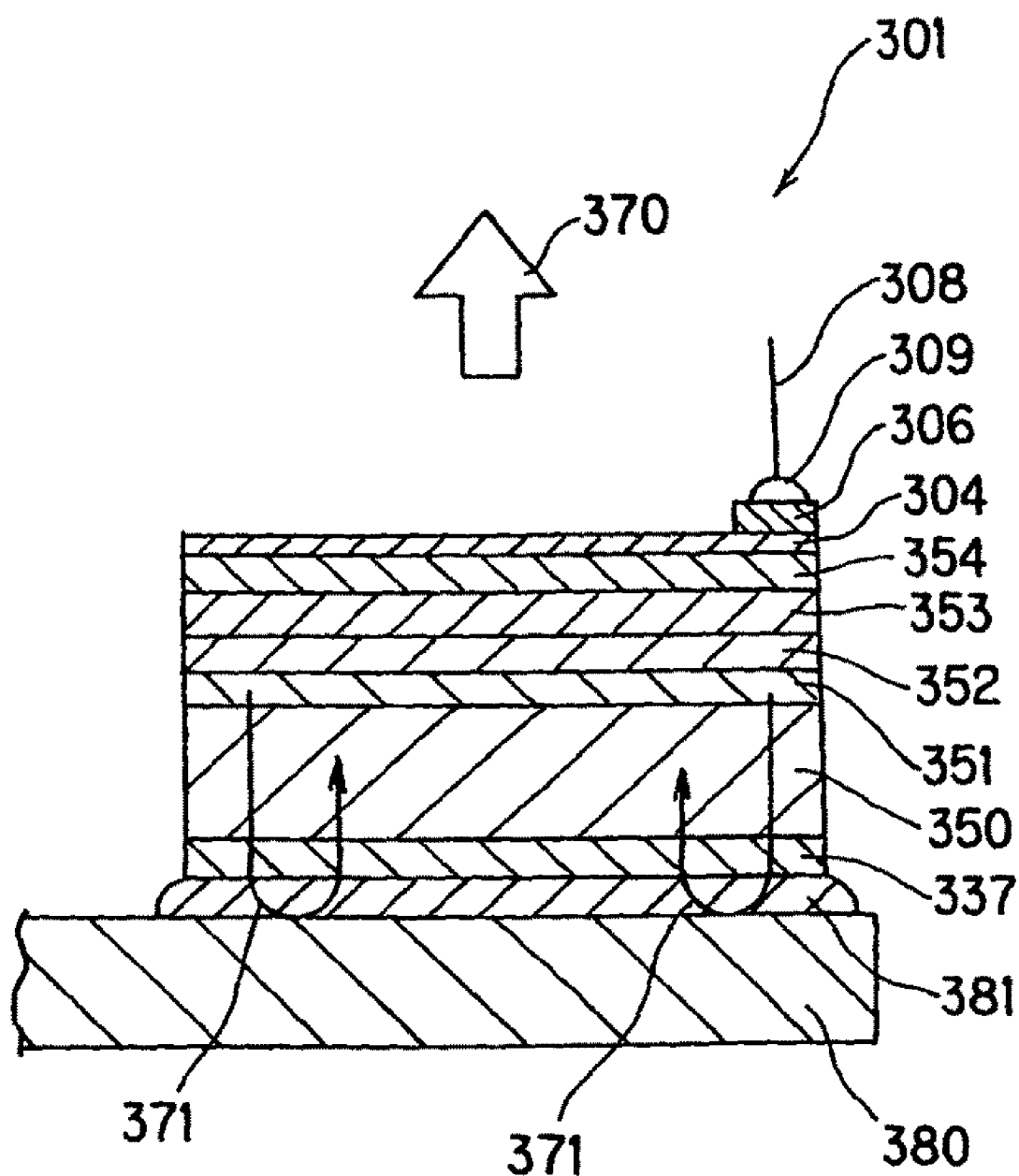
FIG. 24 is a sectional view showing a Ga$_2$O$_3$ light-emitting device according to a seventeenth embodiment of the invention.

FIG. 24 shows a section of a $Ga_2O_3$ light-emitting device according to the seventeenth embodiment of the invention wherein a light-emitting device 301 is provided with an n-type $\beta$-$Ga_2O_3$ substrate 350 made of a $\beta$-$Ga_2O_3$ single crystal and exhibiting n-type conductivity, an n-type $\beta$-$Al_{1.4}Ga_{0.6}O_3$ cladding layer 351 exhibiting n-type conductivity and formed on the n-type $\beta$-$Ga_2O_3$ substrate 350, a β-$Ga_2O_3$ active layer 352 made of the β-$Ga_2O_3$ and formed on the n-type β-$Al_{1.4}Ga_{0.6}O_3$ cladding layer 351, a p-type β-$Al_{1.4}Ga_{0.6}O_3$ cladding layer 353 exhibiting p-type conductivity and formed on the top of the β-$Ga_2O_3$ active layer 352, a p-type $Ga_2O_3$ contact layer 354 made of a β-$Ga_2O_3$ single crystal, exhibiting p-type conductivity, and formed on the top of the p-type β-$Al_{1.4}Ga_{0.6}O_3$ cladding layer 353, a transparent electrode 304 formed on the top of the p-type β-$Ga_2O_3$ contact layer 354, a bonding electrode 306 formed on a part of the transparent electrode 304, and an n-electrode 337 formed on the whole surface of the bottom of the n-type β-$Ga_2O_3$ substrate 350. The bonding electrode 306 is formed from, for example, Pt, while the n-electrode 337 is formed from, for example, Au.

A lead 308 is connected to the light emitting device 301 at a bonding 309 through the bonding electrode 306, while the light emitting device 301 is installed on a printed-circuit board 380 through a metallic paste 381.

A carrier concentration of the p-type β-$Al_{1.4}Ga_{0.6}O_3$ cladding layer 353 is made to be lower than that of the p-type $Ga_2O_3$ contact layer 354 in accordance with the above-mentioned method for controlling a conductivity of a thin film. In a similar way, a carrier concentration of the n-type β-$Al_{1.4}Ga_{0.6}O_3$ cladding layer 351 is made to be lower than that of the n-type β-$Ga_2O_3$ substrate 350.

The β-$Ga_2O_3$ active layer 352 is in a double heterojunction wherein it is sandwiched between the n-type β-$Al_{1.4}Ga_{0.6}O_3$ cladding layer 351 and the p-type β-$Al_{1.4}Ga_{0.6}O_3$ cladding layer 353, and it is formed from β-$Ga_2O_3$ having a smaller bandgap than those of the respective cladding layers 351 and 353.

An emission light 371 is reflected by the printed-circuit board 380 to be output upwards.

Figure 25:
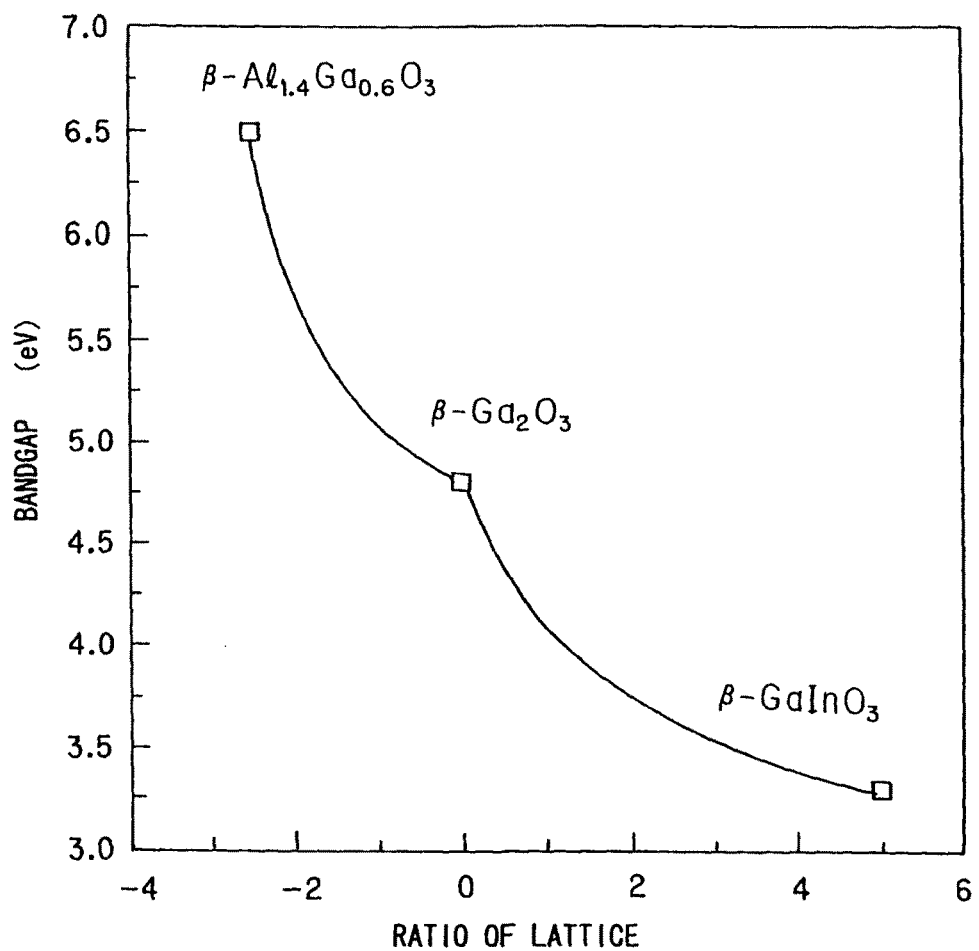
FIG. 25 is a diagram showing a relationship between a lattice constant ratio of β-Al$_{1.4}$O$_{0.6}$O$_3$, β-Ga$_2$O$_3$ and β-GaInO$_3$, and a bandgap.

FIG. 25 indicates a relationship between a ratio of lattice constants of β-$Al_{1.4}Ga_{0.6}O_3$, β-$Ga_2O_3$ and β-$GaInO_3$, and a bandgap. From the relationship, it is found that when a concentration of Al is increased, its bandgap increases and its ratio of lattice constants decreases, while when a concentration of In increases, the bandgap decreases and the ratio of lattice constants increases. Concerning β-$Ga_2O_3$, a relationship is represented as shown in FIG. 25 with respect to the b-axis <010> direction and the c-axis <001> direction, while the same tendency is observed with respect to the a-axis <100> direction.

According to the seventeenth embodiment, the following advantages are obtained.

(a) Due to a broad bandgap contained in a β-$Ga_2O_3$ single crystal forming the active layer 352, it is possible to emit a light having a short wavelength, for example, a short wavelength of as 260 nm. Furthermore, an addition of Al makes possible to emit a light having a shorter wavelength.

(b) Because of double heterojunction, such a possibility that electrons and positive holes being carriers are confined in the β-$Ga_2O_3$ active layer 352 and recombined, becomes high. Accordingly, luminous efficiency is remarkably elevated.

(c) The n-type β-$Ga_2O_3$ substrate 350 and the respective layers 351 to 354 consist of β-$Ga_2O_3$ as their major components, whereby it makes possible to require no buffer layer, so that a p-type layer having high crystallinity can be formed.

(d) Since the n-type β-$Ga_2O_3$ substrate 350 is conductive, a vertical type structure from which electrodes may be lead out via the top and the bottom routes is applicable. As a result, a layer constitution and manufacturing processes thereof can be simplified.

(e) Since the n-type β-$Ga_2O_3$ substrate 350 has high permeability in its emitting region, light-extraction efficiency may be increased, so that ultraviolet ray having such a short wavelength of 260 nm can be extracted also from a side of the substrate.

(f) Since an oxide β-$Ga_2O_3$ single crystal is used for the n-type β-$Ga_2O_3$ substrate 350 and the respective layers 351 to 354, a light-emitting device which is stably operated even in the atmospheric air of a high temperature can be formed.

(g) An emission light is output to the outside as the output light 370 which transmits the transparent electrode 304 to be output upwards. Besides, the emission light 371 directs to the bottom of the n-type β-$Ga_2O_3$ substrate 350 is reflected, for example, by the n-electrode 337 or the metallic paste 381 to be output upwards. Accordingly, when compared with a case where the emission light 371 outputs directly to the outside, its emission intensity increases.

The β-$Ga_2O_3$ active layer 352 may be formed from β-$GaInO_3$, and in this case, it may be formed as a cladding layer from β-$Ga_2O_3$. Further, it may have a quantum well structure by which luminous efficiency can be elevated.

Eighteenth Embodiment

Figure 26:
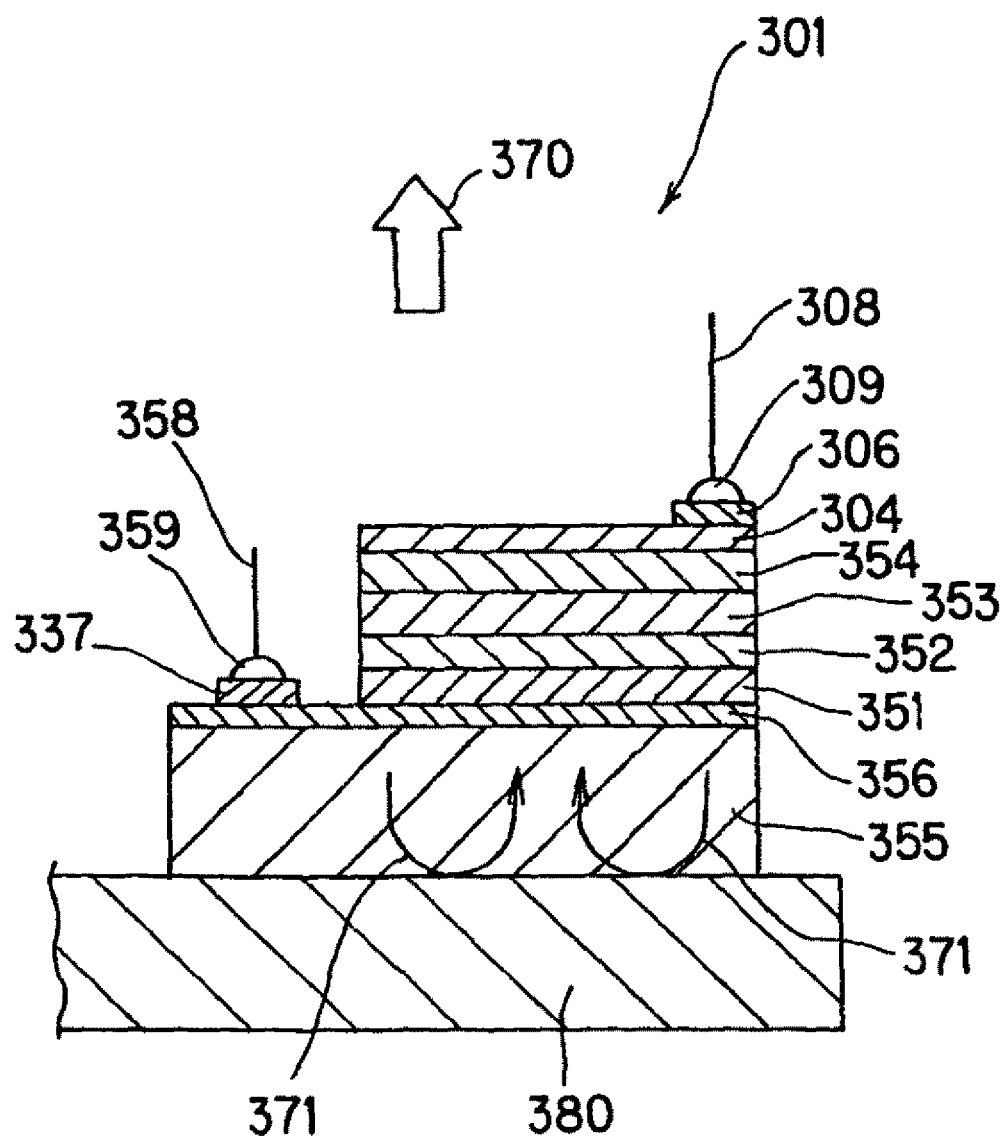
FIG. 26 is a sectional view showing a Ga$_2$O$_3$ light-emitting device according to a eighteenth embodiment of the invention.
Figure 27:
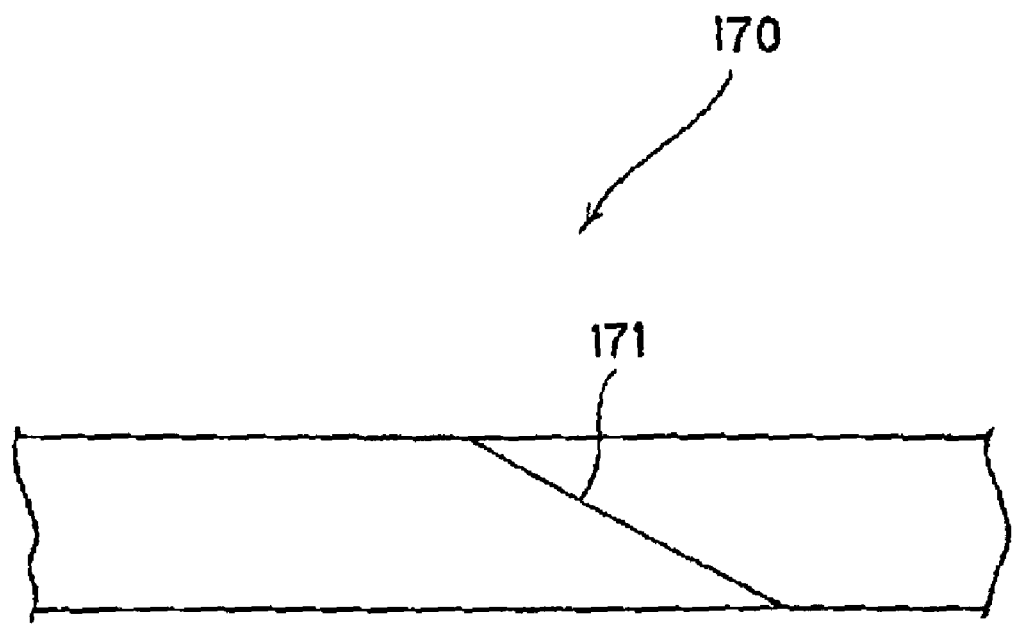
FIG. 27 is a view showing a conventional single crystal substrate.

FIG. 26 shows a section of a $Ga_2O_3$ light-emitting device according to the eighteenth embodiment of the invention wherein a light-emitting device 301 is provided with an insulation type β-$Ga_2O_3$ substrate 355 made of a β-$Ga_2O_3$ single crystal, an n-type β-$Ga_2O_3$ contact layer 356 made of a β-$Ga_2O_3$ single crystal, exhibiting n-type conductivity, and formed on the top of the insulation type β-$Ga_2O_3$ substrate 355, an n-type β-$Al_{1.4}Ga_{0.6}O_3$ cladding layer 351 formed on a part of the n-type β-$Ga_2O_3$ contact layer 356, a β-$Ga_2O_3$ active layer 352 made of β-$Ga_2O_3$ and formed on the n-type β-$Al_{1.4}Ga_{0.6}O_3$ cladding layer 351, a p-type β-$Al_{1.4}Ga_{0.6}O_3$ cladding layer 353 exhibiting p-type conductivity and formed on the β-$Ga_2O_3$ active layer 352, a p-type $Ga_2O_3$ contact layer 354 made of a β-$Ga_2O_3$ single crystal, exhibiting p-type conductivity, and formed on the p-type β-$Al_{1.4}Ga_{0.6}O_3$ cladding layer 353, a transparent electrode 304 formed on the p-type β-$Ga_2O_3$ contact layer 354, a bonding electrode 306 formed on a part of the transparent electrode 304, and an n-electrode 337 formed on the n-type β-$Ga_2O_3$ contact layer 356. The bonding electrode 306 is formed from, for example, Pt, and a lead 308 is connected to the light emitting device at a bonding 309, while the n-electrode 337 is formed from, for example, Au, and a lead 358 is connected to the light emitting device at a bonding 359.

A carrier concentration of the p-type β-$Al_{1.4}Ga_{0.6}O_3$ cladding layer 353 is made to be lower than that of the p-type $Ga_2O_3$ contact layer 354, while a carrier concentration of the n-type β-$Al_{1.4}Ga_{0.6}O_3$ cladding layer 351 is made to be lower than that of the n-type β-$Ga_2O_3$ contact layer 356. The light emitting device 301 is installed on a printed-circuit board 380.

The β-$Ga_2O_3$ active layer 352 is in a double heterojunction wherein it is sandwiched between the n-type p-$Al_{1.4}Ga_{0.6}O_3$ cladding layer 351 and the p-type β-$Al_{1.4}Ga_{0.6}O_3$ cladding layer 353, and it is formed from β-$Ga_2O_3$ having a smaller bandgap than those of the respective cladding layers 351 and 353 as in the case of the seventeenth embodiment.

An emission light 371 is reflected by the printed-circuit board 380 to be output upwards.

According to the eighteenth embodiment, the following advantages are obtained.

(a) Due to a broad bandgap contained in a β-$Ga_2O_3$ single crystal forming the active layer 352, it is possible to emit a light having a short wavelength, for example, a short wavelength of as 260 nm. Furthermore, an addition of Al makes possible to emit a light having a shorter wavelength.

(b) Because of double heterojunction, such a possibility that electrons and positive holes being carriers are confined in the β-$Ga_2O_3$ active layer 352 and recombined, becomes high. Accordingly, luminous efficiency is remarkably elevated.

(c) The insulation type β-$Ga_2O_3$ substrate 355 and the n-type β-$Al_{1.4}Ga_{0.6}O_3$ cladding layer 351 consist of β-$Ga_2O_3$ as their major components, whereby it makes possible to require no buffer layer, so that an n-type layer having high crystallinity can be formed.

(d) Since the insulation type β-$Ga_2O_3$ substrate 355 has high permeability in its emitting region, light-extraction efficiency may be increased.

(e) Since an oxide β-$Ga_2O_3$ single crystal is used for the insulation type β-$Ga_2O_3$ substrate 355 and the respective layers 351, 353, 352, 356, a light-emitting device which is stably operated even in the atmospheric air of a high temperature can be formed.

(f) An emission light is output to the outside as the output light 370 which transmits the transparent electrode 304 to be output upwards. Besides, the emission light 371 directs to the bottom of the n-type β-$Ga_2O_3$ substrate 350 is reflected, for example, by the printed-circuit board 380 to be output upwards. Accordingly, when compared with a case where the emission light 371 outputs directly to the outside, its emission intensity increases.

In the twelfth to the eighteenth embodiments, the light-emitting device 301 may be provided with a buffer layer wherein the buffer layer is formed in between the n-type substrate 302 and the p-type layer 303 (the twelfth embodiment, FIG. 17), in between the n-type substrate 302 and the n-type layer 307 (the thirteenth embodiment, FIG. 20), in between the p-type substrate 312 and the n-type layer 313 (the fourteenth embodiment, FIG. 21), in between the p-type substrate 312 and the p-type layer 303 (the fifteenth embodiment, FIG. 22), in between the insulation type substrate 316 and the n-type layer 317 (the sixteenth embodiment, FIG. 23), in between the n-type β-$Ga_2O_3$ substrate 350 and the n-type β-$Al_{1.4}Ga_{0.6}O_3$ cladding layer 351 (the seventeenth embodiment, FIG. 24), and in between the insulation type β-$Ga_2O_3$ substrate 355 and the n-type β-$Ga_2O_3$ contact layer 356 (the eighteenth embodiment, FIG. 26), respectively.

Furthermore, electron beam, ion beam and the like other than laser beam may be applied as excitation beam, so far as it can release chemical species such as metallic atoms from a metallic target as a result of irradiation thereto.

Moreover, other types of $Ga_2O_3$ may be used for β-$Ga_2O_3$.

Although the twelfth to the eighteenth embodiments have been described in connection with a light-emitting device, the invention is also applicable for a photosensor in which an input light is converted to electrical signals.

INDUSTRIAL APPLICABILITY

As described above, a β-$Ga_2O_3$ single crystal is grown from a β-$Ga_2O_3$ seed crystal in a predetermined direction, whereby the β-$Ga_2O_3$ single crystal with reduced cracking and having a weakened twinning tendency, high crystallinity, and good workability can be obtained in accordance with the present invention.

Furthermore, a β-$Ga_2O_3$ single crystal is grown on a substrate to form a thin film of the β-$Ga_2O_3$ single crystal on the substrate.

Moreover, when thin films of the β-$Ga_2O_3$ single crystal are combined with each other, a light-emitting device of PN junction can be formed. Thus, light emission in an ultraviolet region becomes possible due to a bandgap contained in the $Ga_2O_3$ single crystal, so that the present invention can be applied to fluorescent lamps of mercury-free, photocatalysts providing a clean atmosphere, new-generation DVD by which high-density recording is realized, and other equipment.

The invention claimed is:

1. A thin-film single crystal growing method, comprising:
    preparing a substrate comprising a β-$Ga_2O_3$ single crystal;
    irradiating an excitation beam on a metallic target comprising Ga or an alloy comprising Ga in an atmosphere comprising at least a gas selected from an oxygen gas, an oxygen gas comprising ozone, a pure ozone gas, an $N_2O$ gas, an $NO_2$ gas, an oxygen gas comprising oxygen radicals, and oxygen radicals; and
    combining chemical species including one of atoms, molecules, and ions released from the metallic target by irradiation of the excitation beam with the gas to form a thin-film single crystal β-$Ga_2O_3$ on the substrate,
    wherein the β-$Ga_2O_3$ single crystal substrate is grown in a b-axis <010> direction.

2. The thin-film single crystal growing method as defined in claim 1, wherein the growth of a thin film single crystal comprising the β-$Ga_2O_3$ is implemented by forming a buffer layer comprising the β-$Ga_2O_3$ thin-film single crystal, and growing the thin-film single crystal on the buffer layer.

3. The thin-film single crystal growing method as defined in claim 1, wherein the preparation of the substrate is conducted with an FZ (Floating Zone) method.

4. The thin-film single crystal growing method as defined in claim 1, wherein a plane direction of the β-$Ga_2O_3$ single crystal substrate comprises a (100) plane.

5. The thin-film single crystal growing method as defined in claim 1, wherein a plane direction of the β-$Ga_2O_3$ single crystal substrate comprises a (010) plane.

6. The thin-film single crystal growing method as defined in claim 1, wherein a plane direction of the β-$Ga_2O_3$ single crystal substrate comprises a (001) plane.

7. The thin-film single crystal growing method as defined in claim 1, wherein a plane direction of the β-$Ga_2O_3$ single crystal substrate comprises a (101) plane.

8. The thin-film single crystal growing method as defined in claim 1, wherein said preparing the substrate comprises:
    growing the β-$Ga_2O_3$ single crystal substrate from a β-$Ga_2O_3$ seed crystal in the b-axis <010> direction.

9. A thin-film single crystal growing method, comprising:
    preparing a substrate comprising a β-$Ga_2O_3$ single crystal;
    irradiating an excitation beam on a metallic target comprising Ga or an alloy comprising Ga in an atmosphere comprising at least a gas selected from an oxygen gas, an oxygen gas comprising ozone, a pure ozone gas, an $N_2O$ gas, an $NO_2$ gas, an oxygen gas comprising oxygen radicals, and oxygen radicals; and
    combining chemical species including one of atoms, molecules, and ions released from the metallic target by irradiation of the excitation beam with the gas to form a thin-film single crystal comprising β-$Ga_2O_3$ on the substrate,
    wherein the β-$Ga_2O_3$ single crystal substrate is grown in a c-axis <001> direction.

10. The thin-film single crystal growing method as defined in claim 9, wherein a plane direction of the β-$Ga_2O_3$ single crystal substrate comprises a (100) plane.

11. The thin-film single crystal growing method as defined in claim 9, wherein a plane direction of the β-$Ga_2O_3$ single crystal substrate comprises a (010) plane.

12. The thin-film single crystal growing method as defined in claim 9, wherein a plane direction of the β-$Ga_2O_3$ single crystal substrate comprises a (001) plane.

13. The thin-film single crystal growing method as defined in claim 9, wherein a plane direction of the β-$Ga_2O_3$ single crystal substrate comprises a (101) plane.

14. The thin-film single crystal growing method as defined in claim 9, wherein said preparing the substrate comprises:
growing the β-$Ga_2O_3$ single crystal substrate from a β-$Ga_2O_3$ seed crystal in the c-axis <001> direction.

* * * * *